(12) United States Patent
Gul et al.

(10) Patent No.: US 12,043,541 B2
(45) Date of Patent: *Jul. 23, 2024

(54) OVERHANGING DEVICE STRUCTURES AND RELATED METHODS OF MANUFACTURE

(71) Applicant: X-Celeprint Limited, Dublin (IE)

(72) Inventors: Raja Fazan Gul, Cork (IE); Ronald S. Cok, Rochester, NY (US); Steven Kelleher, Midleton (IE); António José Marques Trindade, Cork (IE); Alin Mihai Fecioru, Cork (IE); David Gomez, Holly Springs, NC (US); Christopher Andrew Bower, Raleigh, NC (US); Salvatore Bonafede, Chapel Hill, NC (US); Matthew Alexander Meitl, Durham, NC (US)

(73) Assignee: X-Celeprint Limited, Dublin (IE)

( * ) Notice: Subject to any disclaimer, the term of this patent is extended or adjusted under 35 U.S.C. 154(b) by 47 days.

This patent is subject to a terminal disclaimer.

(21) Appl. No.: 17/588,932

(22) Filed: Jan. 31, 2022

(65) Prior Publication Data

US 2022/0162056 A1 May 26, 2022

Related U.S. Application Data

(63) Continuation of application No. 16/842,591, filed on Apr. 7, 2020, now Pat. No. 11,274,035.

(Continued)

(51) Int. Cl.
*B81B 7/00* (2006.01)
*H01L 29/06* (2006.01)

(52) U.S. Cl.
CPC ............ *B81B 7/0009* (2013.01); *B81B 7/008* (2013.01); *H01L 29/0684* (2013.01)

(58) Field of Classification Search
None
See application file for complete search history.

(56) References Cited

U.S. PATENT DOCUMENTS 5,313,177 A  5/1994 Hickernell et al.
5,872,493 A  2/1999 Ella
(Continued)

FOREIGN PATENT DOCUMENTS

GB  2 496 183 A  5/2013
JP  2007-208845 A  8/2007
(Continued)

OTHER PUBLICATIONS

Bower, C. A. et al., Emissive displays with transfer-printed assemblies of 8 μm×15 μm inorganic light-emitting diodes, Photonics Research, 5(2):A23-A29, (2017).

(Continued)

*Primary Examiner* — Benjamin P Sandvik
(74) *Attorney, Agent, or Firm* — Choate, Hall & Stewart LLP; Michael D. Schmitt

(57) ABSTRACT

A overhanging device cavity structure comprises a substrate and a cavity disposed in or on the substrate. The cavity comprises a first cavity side wall and a second cavity side wall opposing the first cavity side wall on an opposite side of the cavity from the first cavity side wall. A support extends from the first cavity side wall to the second cavity side wall and at least partially divides the cavity. A device is disposed on, for example in direct contact with, the support and extends from the support into the cavity.

11 Claims, 19 Drawing Sheets

Related U.S. Application Data

(60) Provisional application No. 62/838,262, filed on Apr. 24, 2019.

(56) References Cited

U.S. PATENT DOCUMENTS

| | | |
|---|---|---|
| 5,919,548 A * | 7/1999 | Barron .............. B81C 1/00611 |
| | | 438/692 |
| 6,078,229 A | 6/2000 | Funada et al. |
| 6,111,338 A | 8/2000 | Otsuchi et al. |
| 6,142,358 A | 11/2000 | Cohn et al. |
| 6,566,981 B2 | 5/2003 | Urabe et al. |
| 6,628,177 B2 | 9/2003 | Clark et al. |
| 6,911,708 B2 | 6/2005 | Park |
| 7,109,828 B2 | 9/2006 | Takayama et al. |
| 7,161,233 B2 | 1/2007 | Delapierre |
| 7,195,733 B2 | 3/2007 | Rogers et al. |
| 7,199,683 B2 | 4/2007 | Thalhammer et al. |
| 7,307,369 B2 | 12/2007 | Yokota et al. |
| 7,312,675 B2 | 12/2007 | Ruby et al. |
| 7,354,801 B2 | 4/2008 | Sugiyama et al. |
| 7,368,034 B2 | 5/2008 | Ikeda et al. |
| 7,423,501 B2 | 9/2008 | Kim et al. |
| 7,463,117 B2 | 12/2008 | Ohara et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,982,364 B2 | 7/2011 | Takayama et al. |
| 7,984,648 B2 | 7/2011 | Horning et al. |
| 7,986,075 B2 | 7/2011 | Asai et al. |
| 7,990,233 B2 | 8/2011 | Suzuki |
| 8,039,847 B2 | 10/2011 | Nuzzo et al. |
| 8,058,768 B2 | 11/2011 | Milsom et al. |
| 8,198,621 B2 | 6/2012 | Rogers et al. |
| 8,261,660 B2 | 9/2012 | Menard |
| 8,333,860 B1 | 12/2012 | Bibl et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,506,867 B2 | 8/2013 | Menard |
| 8,558,243 B2 | 10/2013 | Bibl et al. |
| 8,618,721 B2 | 12/2013 | Ichikawa et al. |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,791,474 B1 | 7/2014 | Bibl et al. |
| 8,794,501 B2 | 8/2014 | Bibl et al. |
| 8,827,550 B2 | 9/2014 | Abdelmoneum et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,362,887 B2 | 6/2016 | Shealy |
| 9,367,094 B2 | 6/2016 | Bibl et al. |
| 9,412,727 B2 | 8/2016 | Menard et al. |
| 9,444,428 B2 | 9/2016 | Ruby et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,667,220 B2 | 5/2017 | Sridaran et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 10,103,069 B2 | 10/2018 | Bower et al. |
| 10,153,256 B2 | 12/2018 | Cok et al. |
| 10,200,013 B2 | 2/2019 | Bower et al. |
| 10,224,460 B2 | 3/2019 | Bower et al. |
| 10,790,173 B2 | 9/2020 | Gomez et al. |
| 11,088,007 B1 | 8/2021 | Fecioru |
| 11,274,035 B2 * | 3/2022 | Gul .................. B81B 7/008 |
| 11,834,330 B2 | 12/2023 | Cok et al. |
| 11,884,537 B2 | 1/2024 | Cok et al. |
| 11,897,760 B2 | 2/2024 | Cok et al. |
| 2002/0114053 A1 * | 8/2002 | Yasuda ............... B81B 3/0067 |
| | | 359/224.1 |
| 2002/0140533 A1 | 10/2002 | Miyazaki et al. |
| 2003/0117369 A1 | 6/2003 | Spitzer et al. |
| 2003/0141570 A1 | 7/2003 | Chen et al. |
| 2004/0029356 A1 | 2/2004 | Timme et al. |
| 2004/0188782 A1 | 9/2004 | Fujii |
| 2005/0013533 A1 | 1/2005 | Wiegele et al. |
| 2005/0116352 A1 | 6/2005 | Warashina et al. |
| 2006/0063462 A1 | 3/2006 | Ding et al. |
| 2006/0197173 A1 | 9/2006 | Mase |
| 2007/0004175 A1 * | 1/2007 | Harris, Jr. ............ B28D 5/0011 |
| | | 438/460 |
| 2007/0228880 A1 | 10/2007 | Higuchi et al. |
| 2008/0061026 A1 | 3/2008 | Milanovic et al. |
| 2009/0090531 A1 | 4/2009 | Schmitz et al. |
| 2009/0127978 A1 | 5/2009 | Asai et al. |
| 2010/0189444 A1 | 7/2010 | Vernooy et al. |
| 2010/0301431 A1 | 12/2010 | Ding et al. |
| 2010/0306993 A1 | 12/2010 | Mayyas et al. |
| 2011/0129855 A1 | 6/2011 | Pedersen et al. |
| 2012/0038019 A1 | 2/2012 | Stevenson et al. |
| 2012/0043859 A1 * | 2/2012 | Ichikawa ................. H03H 9/21 |
| | | 29/25.35 |
| 2012/0228669 A1 | 9/2012 | Bower et al. |
| 2012/0314388 A1 | 12/2012 | Bower et al. |
| 2013/0221355 A1 | 8/2013 | Bower et al. |
| 2013/0273695 A1 | 10/2013 | Menard et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2014/0264763 A1 | 9/2014 | Meitl et al. |
| 2015/0013458 A1 | 1/2015 | Tanaka |
| 2015/0028362 A1 | 1/2015 | Chan et al. |
| 2015/0135525 A1 | 5/2015 | Bower |
| 2015/0241917 A1 * | 8/2015 | Seok .................... G06F 1/1637 |
| | | 361/679.03 |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372187 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0054353 A1 | 2/2016 | Tanaka |
| 2016/0086855 A1 | 3/2016 | Bower et al. |

(56) References Cited

U.S. PATENT DOCUMENTS

| | | |
|---|---|---|
| 2016/0093600 A1 | 3/2016 | Bower et al. |
| 2017/0048976 A1 | 2/2017 | Prevatte et al. |
| 2017/0148771 A1 | 5/2017 | Cha et al. |
| 2017/0154819 A1 | 6/2017 | Bower et al. |
| 2017/0247249 A1 | 8/2017 | Duqi et al. |
| 2017/0310299 A1 | 10/2017 | Bower et al. |
| 2017/0336435 A1 | 11/2017 | Tseng et al. |
| 2017/0338374 A1 | 11/2017 | Zou et al. |
| 2018/0031822 A1 | 2/2018 | Duqi et al. |
| 2018/0174910 A1 | 6/2018 | Bower et al. |
| 2018/0273375 A1 | 9/2018 | Tanaka |
| 2019/0049717 A1 | 2/2019 | Man |
| 2019/0051552 A1 | 2/2019 | Bower et al. |
| 2019/0107397 A1 | 4/2019 | Ito |
| 2020/0176286 A1 | 6/2020 | Rotzoll et al. |
| 2020/0176670 A1 | 6/2020 | Gomez et al. |
| 2020/0176671 A1 | 6/2020 | Cok et al. |
| 2020/0177149 A1 | 6/2020 | Trindade et al. |
| 2020/0177163 A1 | 6/2020 | Cok |
| 2021/0002128 A1 | 1/2021 | Cok et al. |
| 2021/0024349 A1 | 1/2021 | Cok et al. |
| 2021/0198100 A1 | 7/2021 | Cok et al. |
| 2021/0246017 A1 | 8/2021 | Cok et al. |
| 2021/0246018 A1 | 8/2021 | Cok et al. |

FOREIGN PATENT DOCUMENTS

| | | |
|---|---|---|
| WO | WO-2010/111601 A2 | 9/2010 |
| WO | WO-2010/132552 A1 | 11/2010 |
| WO | WO-2011/129855 A2 | 10/2011 |

OTHER PUBLICATIONS

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

International Search Report for PCT/EP2021/061762 filed Apr. 5, 2021, 3 pages, Jul. 27, 2021.

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Piazza, G. et al., Piezoelectric Aluminum Nitride Vibrating Contour-Mode MEMS Resonators, Journal of Microelectromechanical Systems, 15(6):1406-1418, (2006).

Roscher, H., VCSEL Arrays with Redundant Pixel Designs for 10Gbits/s 2-D Space-Parallel MMF Transmission, Annual Report, optoelectronics Department, (2005).

Trindade, A.J. et al., Precision transfer printing of ultra-thin AlInGaN micron-size light-emitting diodes, Crown, pp. 217-218, (2012).

Written Opinion for PCT/EP2021/061762 filed Apr. 5, 2021, 9 pages, Jul. 27, 2021.

Wu, Q. et al., Hermetic joining of micro-devices using a glass frit intermediate layer and a scanning laser beam, 2nd Electronics Systemintegration Technology Conference, 10 pages, (2008).

Yamashita, T. et al., Piezoelectric Strain Sensor Array Fabricated by Transfer Printing Methods, 2015 IEEE Sensors, 4 pages and 1 page IEEE Xplore abstract, date of conference: Nov. 1-4, 2015.

\* cited by examiner

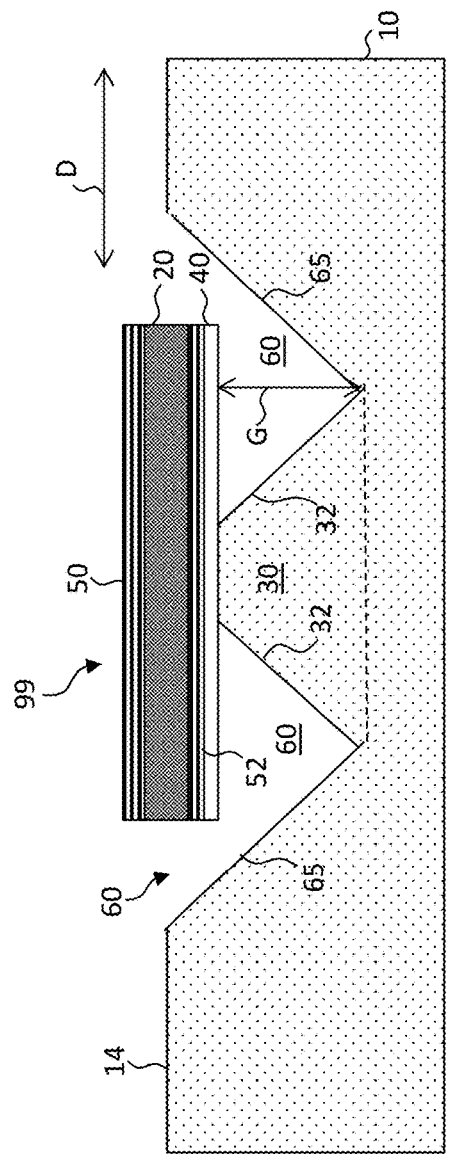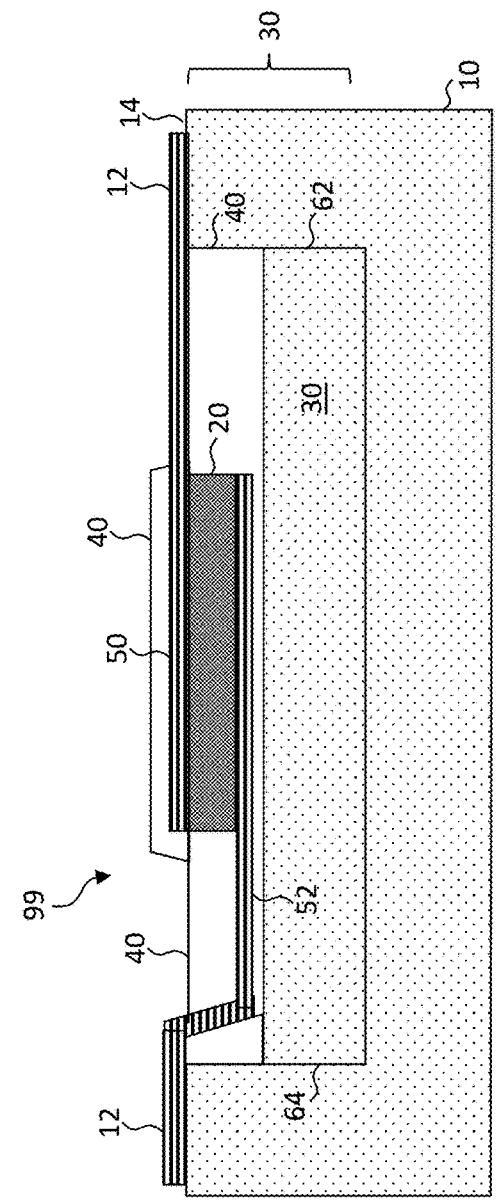

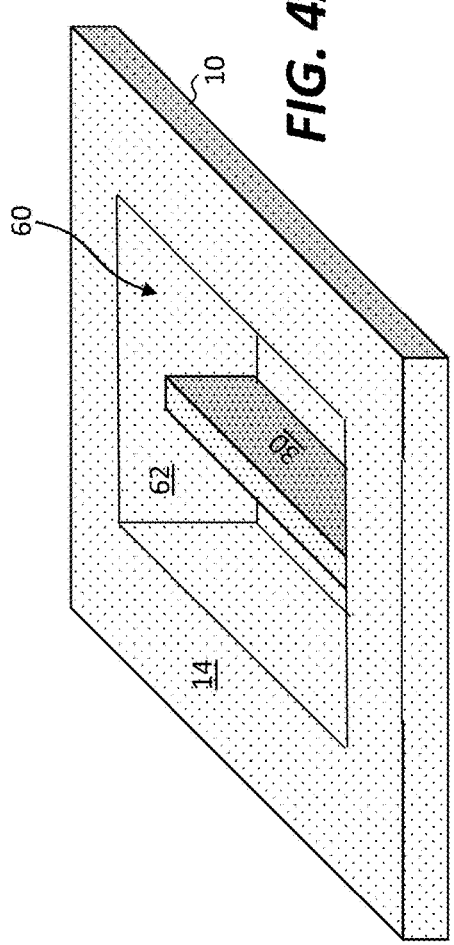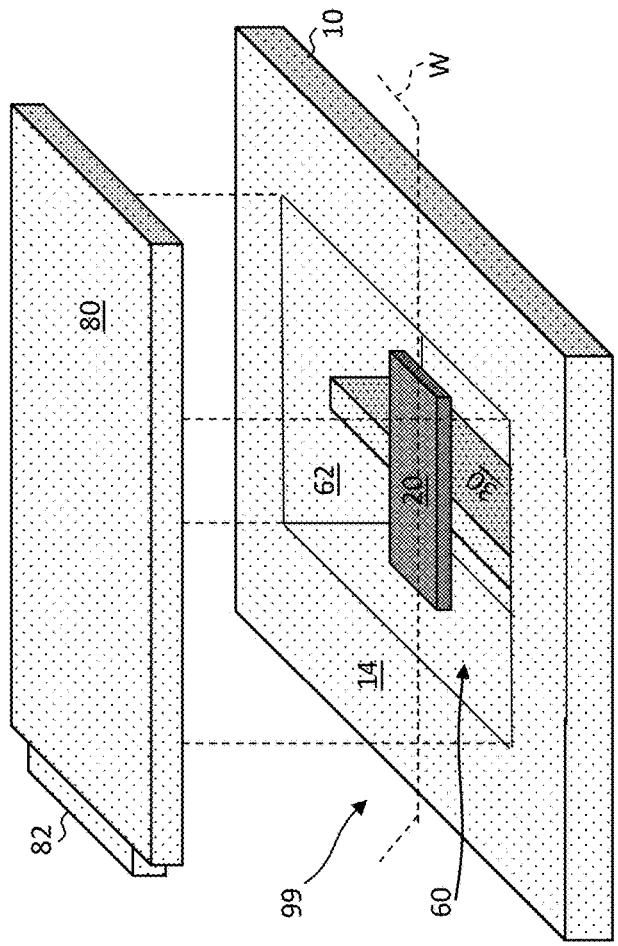
FIG. 4A
FIG. 4B

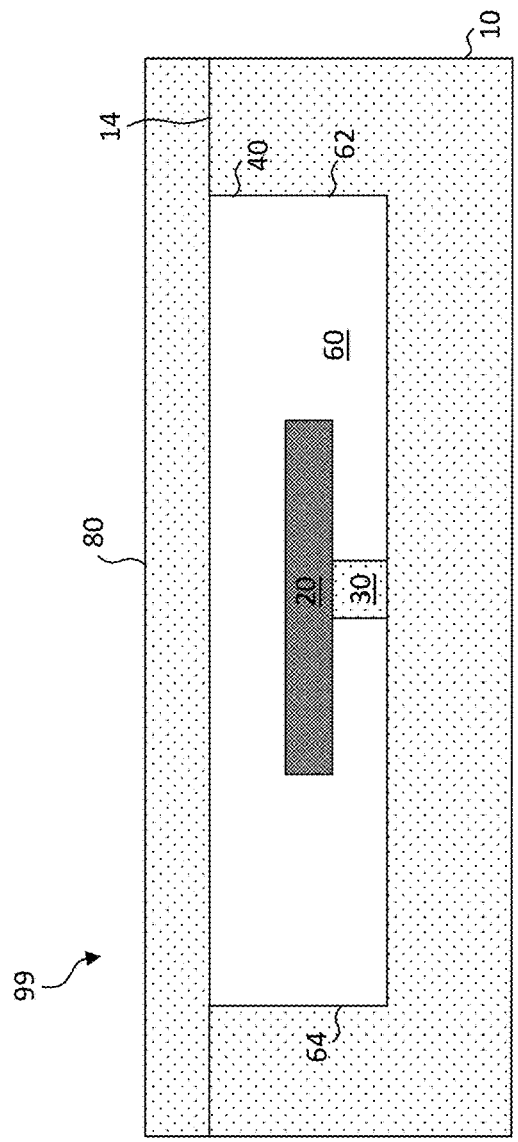
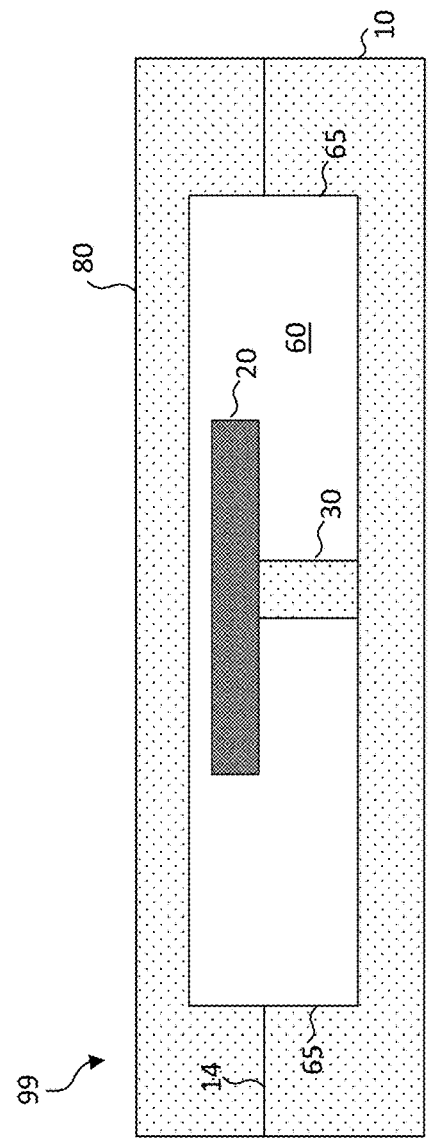
FIG. 4C
FIG. 5

OVERHANGING DEVICE STRUCTURES AND RELATED METHODS OF MANUFACTURE

PRIORITY APPLICATIONS

The present application is a continuation of U.S. patent application Ser. No. 16/842,591, filed on Apr. 7, 2020, which claims the benefit of U.S. Provisional Patent Application No. 62/838,262, filed on Apr. 24, 2019, the disclosure of which is hereby incorporated by reference herein in its entirety.

TECHNICAL FIELD

The present disclosure relates generally to structures including devices having increased mechanical isolation.

BACKGROUND

Substrates with electronically active components distributed over the extent of the substrate are used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating one or more layers of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Micro-electro-mechanical systems (MEMS) are used for processing and controlling electronic and optical signals. Such systems incorporate small mechanical structures made using photolithographic methods and materials and can be integrated into electronic, optical, or electro-optic systems. For example, accelerometers, interferometric modulators, scanners, gyroscopes, piezo-electric energy harvesting, and pressure sensors can be constructed using such techniques. Resonant MEMS devices with electrodes can be used to process signals and produce energy. Typical designs can have solidly mounted beams or beams that are anchored on one or both ends or sides, for example as discussed in U.S. Pat. Nos. 7,984,648, 8,827,550, 7,990,233, U.S. Patent Application Publication No. 2010/0189444, and PCT Publication No. WO 2011/129855.

There remains an on-going need for MEMS structures that are readily constructed and integrated into electronic system and provide improved performance.

SUMMARY

The present disclosure provides, inter alia, structures, materials, and methods for an overhanging device cavity structure comprising a substrate and a cavity disposed in or on the substrate. The cavity comprises a first cavity side wall and a second cavity side wall opposite the first cavity side wall on a side of the cavity opposite the first cavity side. A support extends from the first cavity side wall to the second cavity side wall to at least partially divide the cavity. A device is on or in contact with the support and extends from the support into the cavity and is separated by a gap from a bottom of the cavity. The support can at least partially divide the cavity into two cavity portions and the device can extend into both of the two cavity portions. According to some embodiments of the present disclosure, the support substantially bisects the cavity.

According to some embodiments, the substrate can have a substrate surface, the first and second cavity side walls can extend into the substrate from the substrate surface, and the cavity can be formed in the substrate. According to some embodiments, the substrate has a substrate surface, the cavity side walls project away from the substrate surface and away from the substrate, and the cavity is formed above, over, or on the substrate surface. The substrate can have a substrate surface, the cavity can have a cavity floor, and the cavity floor can be substantially the substrate surface, can be planar, and can be substantially co-planar with the substrate surface. The cavity floor can be rectangular.

According to some embodiments of the present disclosure, the substrate has a substrate surface and the first and second cavity side walls are non-orthogonal to the substrate surface, the cavity has a cavity end wall at each end of the cavity opposite the support and the cavity end walls are non-orthogonal to the substrate surface, or the support has sides that are non-orthogonal to the substrate surface, or any combination of these. In some embodiments, the substrate surface is not parallel to a bottom of the cavity.

According to some embodiments of the present disclosure, the substrate has a substrate surface and the first and second cavity side walls extend to the substrate surface. According to some embodiments of the present disclosure, the substrate has a substrate surface and the first and second cavity side walls do not extend to the substrate surface. According to some embodiments of the present disclosure, the substrate has a substrate surface and the first and second cavity side walls extend beyond the substrate surface.

According to some embodiments of the present disclosure, the device comprises a piezo-electric material and is a piezo-electric device. The device can comprise one or more of aluminum nitride, zinc oxide, bismuth ferrite, lead zirconate titanate, lanthanum-doped lead zirconium titanate, potassium niobate, and (K,Na)NbO3.

According to some embodiments of the present disclosure, the device comprises a top electrode disposed on a device top surface opposite a bulk of the substrate and a bottom electrode disposed on a device bottom surface adjacent a bulk of the substrate. The support can have a first end in contact with the first cavity side wall and a second end in contact with the second cavity side wall. The top electrode extends along the support to the first end and the bottom electrode extends along the support to the second end. According to some embodiments of the present disclosure, the top electrode or bottom electrode is an interdigitated electrode and the device is a surface acoustic wave filter.

According to some embodiments of the present disclosure, the device comprises one or more pairs (for example two pairs) of interdigitated top electrodes disposed on a device top surface opposite a bulk of the substrate. According to some embodiments of the present disclosure, the device comprises one or more pairs (for example two pairs) of interdigitated bottom electrodes disposed on a device top surface adjacent a bulk of the substrate. According to some embodiments, the device is a surface acoustic wave filter.

According to some embodiments of the present disclosure, the substrate comprises an anisotropically etchable material. A cap can be disposed over the cavity and in contact with the substrate or first and second cavity side walls. The cap can be micro-transfer printed from a source wafer to the first and second cavity side walls or substrate and can comprise a broken or separated cap tether.

According to some embodiments of the present disclosure, the substrate comprises sacrificial portions comprising material that is differentially etchable from the device or the substrate.

According to some embodiments of the present disclosure, two or more supports extend from the first cavity side wall to the second cavity side wall so that each of the two or more supports at least partially divides the cavity. A device is on or in contact with each support, extends beyond the support, and is above and over or within the cavity. Some embodiments of the overhanging device cavity structure comprise two or more devices on the support, for example two devices on a single support.

According to some embodiments of the present disclosure, the substrate comprises a semiconductor substrate comprising an electronic circuit.

According to some embodiments of the present disclosure, the device comprises a broken or separated tether.

According to some embodiments of the present disclosure, the substrate has a substrate surface and the device is disposed no higher than the substrate surface so that the device is disposed within the cavity and a device top surface of the device opposite the substrate does not extend beyond the substrate surface. According to some embodiments of the present disclosure, the substrate has a substrate surface and the device is disposed at least partially above the substrate surface and the device is not disposed completely within the cavity so that a device top surface of the device opposite the substrate can be disposed higher than the substrate surface and extends beyond the substrate surface.

According to some embodiments of the present disclosure, an overhanging device cavity structure comprises a substrate having a substrate surface, a cavity comprising cavity walls disposed on the substrate surface, the cavity walls comprising a first cavity side wall and a second cavity side wall opposing the first cavity side wall, a support extending from the first cavity side wall to the second cavity side wall, the support at least partially dividing the cavity, and a device disposed on (e.g., in direct contact with) the support and extending from the support into the cavity.

According to some embodiments of the present disclosure, an overhanging device cavity structure comprises a substrate having a substrate surface, a cavity formed in the substrate and comprising cavity walls, the cavity walls comprising a first cavity side wall and a second cavity side wall opposing the first cavity side wall, a support extending from the first cavity side wall to the second cavity side wall, the support at least partially dividing the cavity, and a device disposed on (e.g., in direct contact with) the support and extending from the support into the cavity.

According to some embodiments of the present disclosure, the cavity has a cavity floor. The cavity floor can be substantially rectangular and planar. The cavity bottom can comprise one or more surfaces corresponding to one or more etch planes of an anisotropically etchable crystal.

According to some embodiments of the present disclosure, a method of making an overhanging device cavity structure comprises providing a substrate and forming a cavity in the substrate, the cavity comprising a first cavity side wall and a second cavity side wall opposing the first cavity side wall, at least partially filling the cavity with a removable material, forming a support cavity in the removable material, the support cavity extending from the first cavity side wall to the second cavity side wall, forming a support in the support cavity, the support at least partially dividing the cavity, disposing a device on the support and the removable material, the device extending from the support into the cavity, removing the removable material, and optionally disposing a cap over the cavity.

According to some embodiments of the present disclosure, a method of making an overhanging device cavity structure comprises providing a substrate comprising a substrate surface, the substrate comprising a material that is anisotropically etchable, disposing a device on the substrate surface, etching the substrate to undercut the device, and optionally disposing a cap over the cavity.

According to some embodiments of the present disclosure, a method of making an overhanging device cavity structure comprises providing a substrate comprising a substrate surface and spaced-apart sacrificial portions separated by a support, disposing a device on the substrate surface and covering at least a portion of the sacrificial portions and the support (e.g., only disposed over the support and the sacrificial portions), etching the sacrificial portions to undercut the device and form a cavity comprising a first cavity side wall and a second cavity side wall opposing the first cavity side wall, the support extending from the first cavity side wall to the second cavity side wall, the support at least partially dividing the cavity, and optionally disposing a cap over the cavity.

According to some embodiments of the present disclosure, a method of making an overhanging device cavity structure comprises providing a substrate comprising a substrate surface, disposing cavity walls on the substrate surface to define a cavity, the cavity comprising a first cavity side wall and a second cavity side wall opposing the first cavity side wall, disposing a support, the support extending from the first cavity side wall to the second cavity side wall, disposing a device on the support, the device extending from the support into the cavity, and optionally disposing a cap over the cavity. The cavity can be at least partially filled with a removable material and the device at least partially disposed on the removable material. The removable material can be removed.

Certain embodiments of the present disclosure provide MEMS structures that are readily manufactured in widely available materials and directly integrated into electronics systems. Embodiments of the present disclosure can have superior performance by reducing unwanted resonance modes by affixing the resonator at the center of the device to a support.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1C is a length-wise cross section of the structure of FIGS. 1A and 1B taken along cross section line L according to illustrative embodiments of the present disclosure;

FIG. 1D is a width-wise cross section of the structure of FIGS. 1A and 1B taken along cross section line W according to illustrative embodiments of the present disclosure;

FIG. 4A is a partial perspective according to illustrative embodiments of the present disclosure, FIG. 4B is an exploded perspective corresponding to FIG. 4A according to illustrative embodiments of the present disclosure, and FIG. 4C is a cross section taken along cross section line W of FIG. 4B according to illustrative embodiments of the present disclosure;

FIG. 5 is a cross section according to illustrative embodiments of the present disclosure;

Figure 1A:
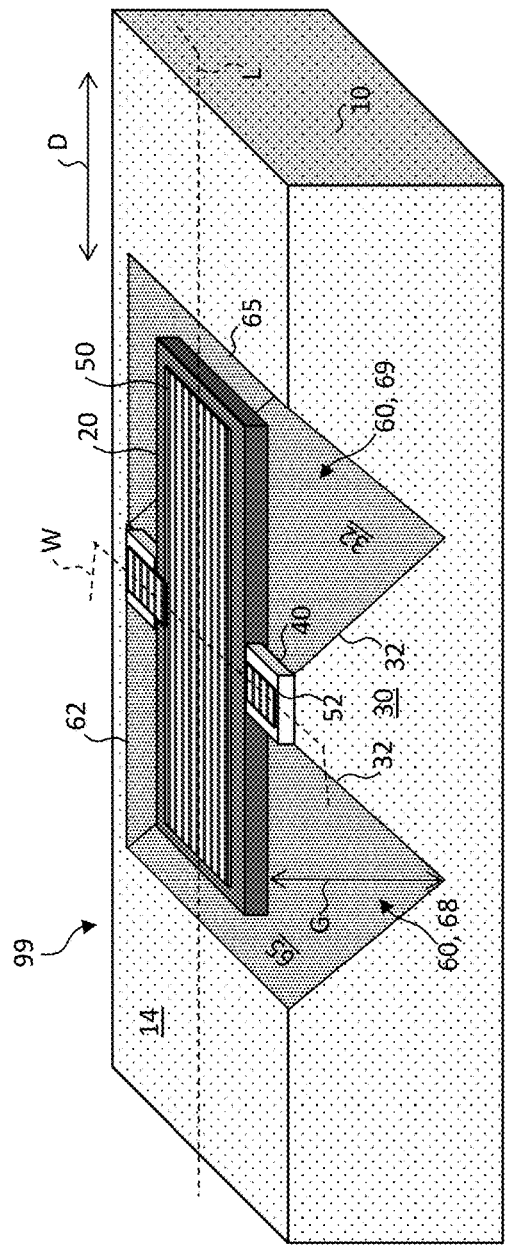
FIG. 1A is a cut-away perspective according to illustrative embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward structures that are more readily constructed and integrated into electronic systems at a lower cost. Some embodiments provide resonators with a reduced number of undesired resonance modes.

Figure 1B:
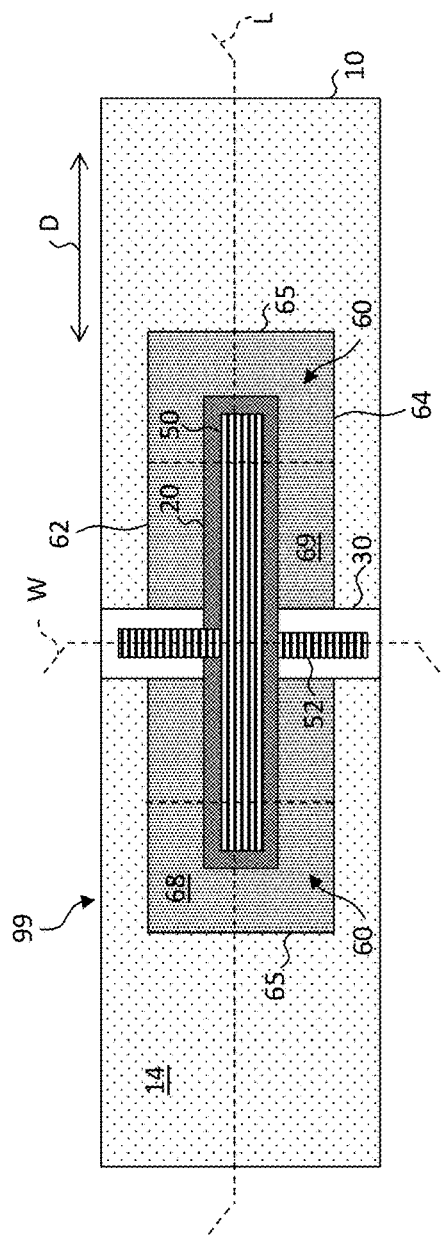
FIG. 1B is a top view of the structure of FIG. 1A according to illustrative embodiments of the present disclosure.
Figure 1E:
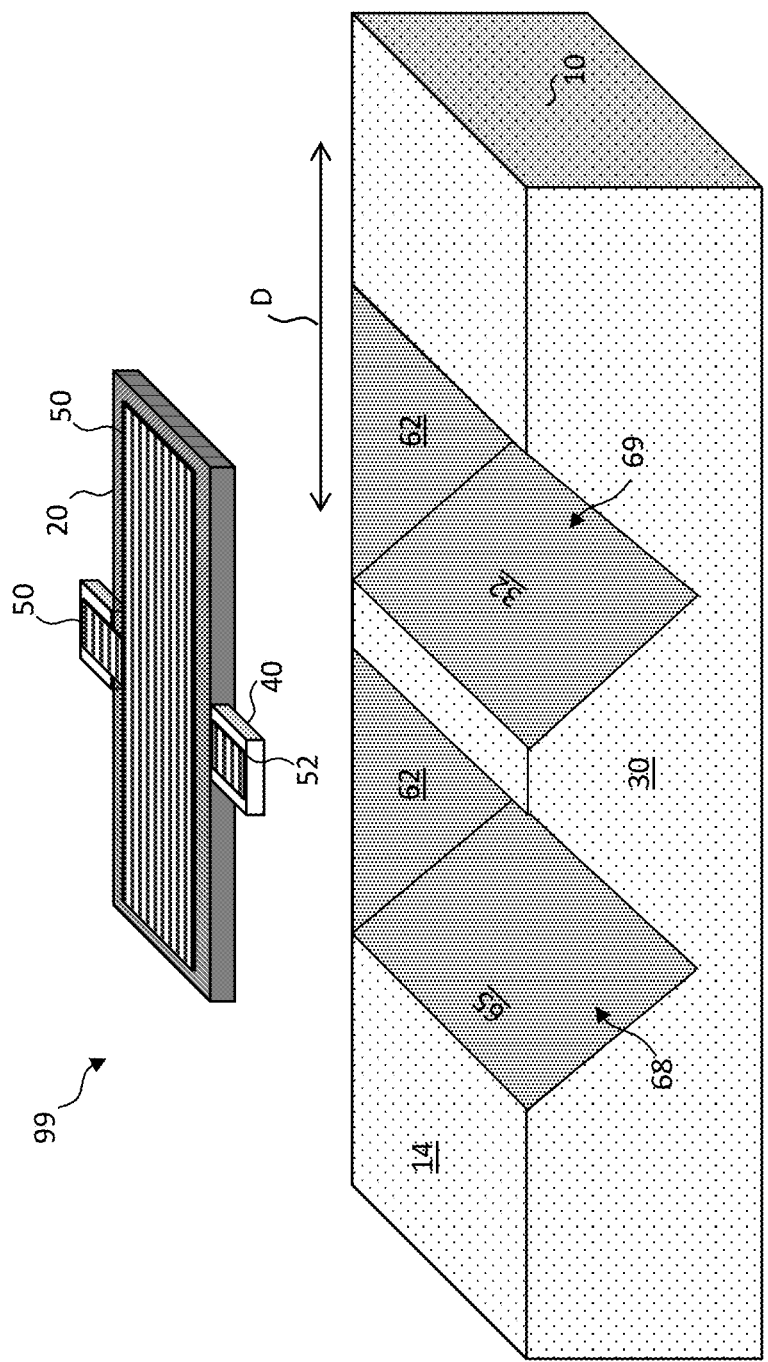
FIG. 1E is an exploded cut-away perspective of the structure of FIG. 1A according to illustrative embodiments of the present disclosure.
Figure 1F:
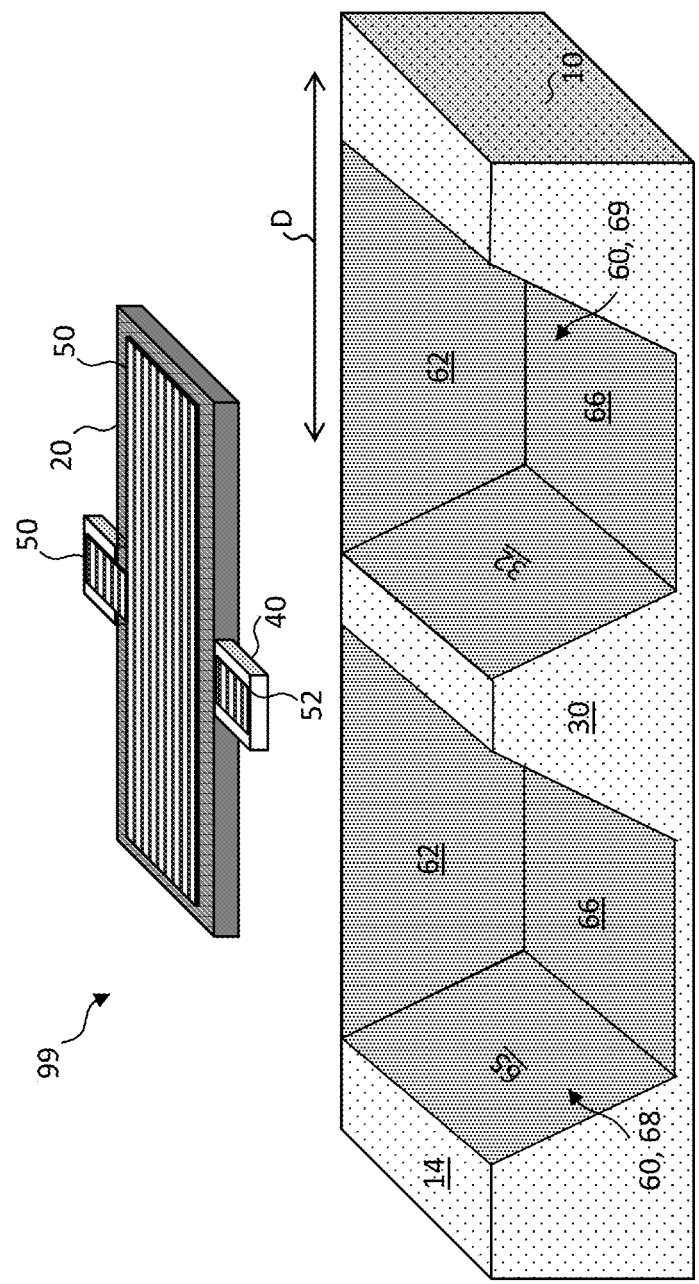
FIG. 1F is an exploded cut-away perspective according to illustrative embodiments of the present disclosure.

Referring to FIGS. 1A-1F and 2A-2B according to some embodiments of the present disclosure, an overhanging device cavity structure 99 comprises a substrate 10 having a substrate surface 14. A cavity 60 is disposed in or on substrate 10. In some embodiments, a cavity 60 can have a cavity floor 66 (e.g., a bottom of cavity 60 as shown in FIG. 1F). Cavity 60 comprises a first cavity side wall 62 and a second cavity side wall 64 opposing first cavity side wall 62. First and second cavity side walls 62, 64 can each be a part of substrate 10 and extend to substrate surface 14 (e.g., as shown in FIGS. 1A-1B and 1E-2A) or project from substrate 10 over substrate surface 14 (e.g., as shown in FIG. 3). First and second cavity side walls 62, 64 can extend in a length direction greater than a width direction of cavity 60 and can extend in a side-wall direction D that is substantially parallel to substrate surface 14 of substrate 10. A support 30 (e.g., wall or ridge) extends from first cavity side wall 62 to second cavity side wall 64. Support 30 at least partially divides cavity 60, for example into first cavity portion 68 and second cavity portion 69. Cavity 60 can also comprise cavity end walls 65 disposed at ends of cavity 60 opposite support 30.

A device 20 is disposed on or in contact (e.g., direct contact) with support 30 and can extend from support 30 into cavity 60. Device 20 can extend in side-wall direction D beyond support 30 in one or two directions and a portion of device 20 is at least partially separated by a gap G from substrate 10 (e.g., in cross section), for example separated from a bottom of cavity 60 (e.g., cavity floor 66 if present). Thus, the extended portions (ends) of device 20 are not in contact (e.g., direct physical contact) with substrate 10. Indeed, with the exception of the portion of device 20 in contact with support 30, device 20 is not in contact with any substrate 10 structure, such as first and second cavity side walls 62, 64, cavity end walls 65, or a bottom of cavity 60. The portion of device 20 in contact with support 30 can be no more than 50% of the area or dimension (e.g., length) of a surface of device 20 (e.g., no more than 40% of the area or dimension, no more than 30% of the area or dimension, no more than 20% of the area or dimension, no more than 10% of the area or dimension, or no more than 5% of the area or dimension). Suitable gaps G can have a size of no more than ten microns (e.g., no more than five microns, no more than two microns, or no more than one micron), for example.

Support 30 can extend entirely along a height of first or second cavity side walls 62, 64 (e.g., as shown in FIG. 1E-2A) so that the top of support 30 can be substantially co-planar with substrate surface 14 or can extend to only a portion of and less than the height of first or second cavity side walls 62, 64 (e.g., as shown in FIGS. 1C and 1D). Thus, support 30 can extend from a bottom of cavity 60 to a top of cavity 60 or only part-way to the top of cavity 60, for example where a top of cavity 60 is coincident with substrate surface 14 of substrate 10. Device 20 or a surface of device 20 can be co-planar with substrate surface 14 (e.g., as illustrated in FIGS. 1E-2A), or layers (e.g., top and bottom electrodes 50, 52) provided on device 20 can be co-planar with substrate surface 14 (e.g., as shown in FIG. 1D). In some embodiments, device 20 or layers on device 20 are not co-planar with substrate surface 14. Device 20 can protrude above or be entirely disposed above substrate surface 14.

In some embodiments of an overhanging device cavity structure 99 of the present disclosure, substrate 10 has a substrate surface 14 and device 20 is disposed within cavity 60 so that a device top surface of the device 20 opposite substrate 10 does not extend beyond substrate surface 14. In some embodiments, support 30 can extend to substrate surface 14 and device 20 can be disposed at least partially above substrate surface 14 in a direction opposite substrate 10. In some embodiments of an overhanging device cavity structure 99 of the present disclosure, substrate 10 has a substrate surface 14 and a device top surface of device 20 opposite substrate 10 extends beyond substrate surface 14 and protrudes above substrate surface 14 so that device 20 is at least partially not disposed within cavity 60. In some embodiments, device 20 is disposed over, and not at all within, substrate 10 (e.g., as shown in FIGS. 1E-3).

Support 30 can at least partially divide cavity 60 into first and second cavity portions 68, 69 and device 20 can extend into first cavity portion 68 and second cavity portion 69. For example, a first end of device 20 can extend into first cavity portion 68 and a second end of device 20 opposite the first end can extend into second cavity portion 69. (First and second cavity portions 68, 69 together can comprise cavity 60. First and second cavity portions 68, 69 can be formed separately or together (e.g., simultaneously).) Cavity 60 can have a length greater than a width, that is have a rectangular perimeter and/or cross section. Cavity 60 can have a curved cross section so that first and second cavity side walls 62, 64 are curved, for example if cavity 60 forms a half cylinder or vertically oriented cylinder. The first and second side walls 62, 64 are then the opposing sides of cavity 60.

Support 30 can substantially bisect cavity 60. By substantially bisect, it is meant that support 30, within the normal limitations of a useful manufacturing process, divides the length of cavity 60 into two substantially equal portions or pockets (e.g., first cavity portion 68 and second cavity portion 69). In some embodiments, cavity 60 is formed by etching two portions of substrate 10 that each define one of first cavity portion 68 and second cavity portion 69 with support 30 disposed therebetween. In some embodiments, cavity 60 is formed (e.g., by etching) and support 30 is subsequently disposed therebetween. First and second cavity portions 68, 69 can be substantially identical (e.g., in one or more of shape and size) or have different shapes and sizes. One or more patterned layers of dielectric 40 can insulate portions of device 20, form portions of support 30, or can encapsulate structures such as device 20 or top and bottom electrodes 50, 52, or both. Thus, support 30 can comprise materials of substrate 10, device 20, dielectric 40, or top and bottom electrodes 50, 52.

Devices 20 can comprise one or more layers of different materials (e.g., including one or more layers of piezoelectric material) or one or more layers can be provided on device 20 (for example top and bottom electrodes 50, 52, dielectric layers, or encapsulation layers). A device 20 is on or in contact with support 30 if one or more layers of device 20 are in direct or indirect physical contact with support 30. For example, device 20 can be in physical contact with support 30 through one or more layers disposed on device 20 or through one or more layers disposed on support 30.

Figure 2A:
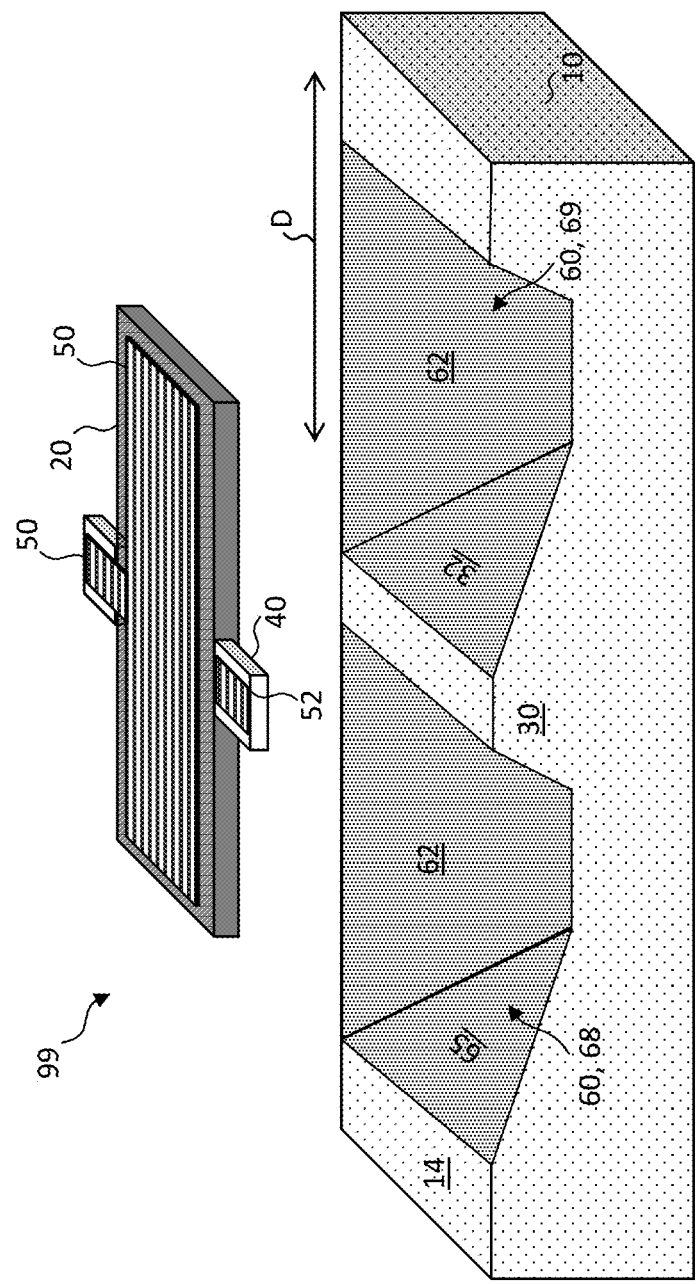
FIG. 2A is an exploded cut-away perspective according to illustrative embodiments of the present disclosure.
Figure 2B:
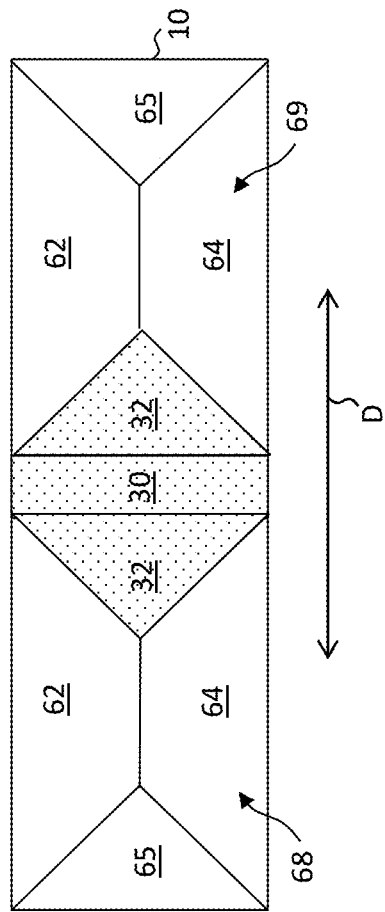
FIG. 2B is a partial top view of the structure of FIG. 2A excluding the device and showing etch planes for an anisotropically etchable crystalline substrate according to illustrative embodiments of the present disclosure.
Figure 3:
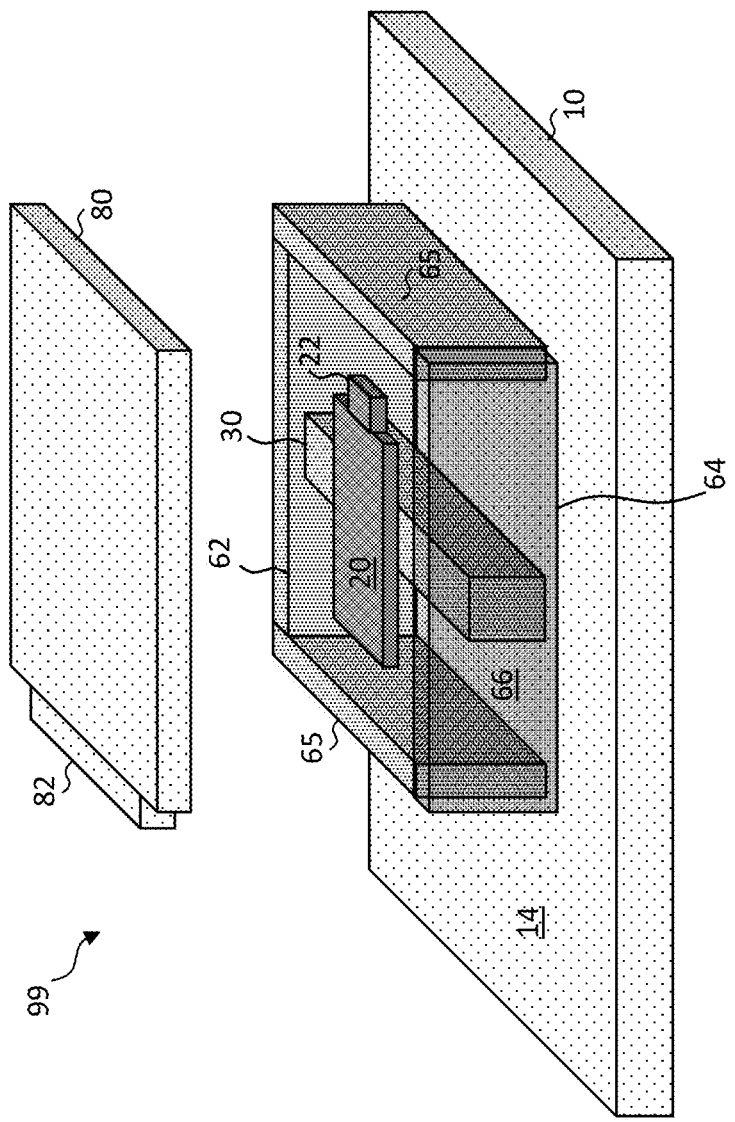
FIG. 3 is an exploded perspective according to illustrative embodiments of the present disclosure.

As shown in FIGS. 1A-1F and 2A-2B, in some embodiments, substrate 10 has a substrate surface 14, first and second cavity side walls 62, 64 extend into substrate 10 from substrate surface 14, and cavity 60 is formed in substrate 10 so that substrate surface 14 is above or is co-planar with the top of cavity 60. In some embodiments, bottom of cavity 60 can be flat and form a cavity floor 66 for example in a plane parallel to substrate surface 14 (as shown in FIG. 1F). In some embodiments, a bottom of cavity 60 need not be flat or form a single planar surface but can be non-planar or effectively one-dimensional (e.g., as in FIG. 1A) and can comprise multiple portions each in a different plane (e.g., as shown in FIGS. 1A, 1C, 1E, and 2A, 2B), for example including one or more of cavity end walls 65, first and second cavity side walls 62, 64, and support side walls 32 of support 30. A bottom of cavity 60 need not be parallel to substrate surface 14 but can comprise one or more portions that are at a non-zero angle with respect to substrate surface 14. For example, in some embodiments, a bottom of cavity 60 can comprise curved portions. First and second cavity side walls 62, 64 need not be orthogonal to substrate surface 14 but can be at a non-orthogonal angle to substrate surface 14 (e.g., as shown in FIG. 2B). Substrate 10 can comprise a material, such as a semiconductor material, like crystalline silicon with a 11001 or 11111 crystal orientation, that is anisotropically etchable and a bottom of cavity 60, first and second cavity side walls 62, 64, and support side walls 32 of support 30 can be defined by etching planes of substrate 10 material. Thus, a bottom of cavity 60 can comprise a plurality of V-shaped lengthwise cross sections (e.g., as shown in FIGS. 1A, 1C, and 1E) or trapezoidal lengthwise cross sections (e.g., as shown in FIGS. 1F, 2A and 2B), for example forming each of first and second cavity portions 68, 69 of cavity 60. Cavity 60 can be etched into substrate 10 and a bottom of cavity 60, first and second cavity side walls 62, 64, and support side walls 32 of support 30 can comprise substrate 10 materials. FIG. 2B is a top view illustrating that each of a bottom of cavity 60, first and second cavity side walls 62, 64, and support side walls 32 of support 30 are non-orthogonal to substrate surface 14 and can be formed by etch planes resulting from anisotropic etching of substrate 10 to form cavity 60. (Cavity 60 can comprise first and second cavity portions 68 and 69).

The perspectives of FIGS. 1A, 1E, 1F, and 2A and the top view of FIG. 1B employ shading to illustrate the various walls of the cavity 60. However, according to some embodiments of the present disclosure, the materials comprising substrate 10, first and second cavity side walls 62, 64, cavity end walls 65, support 30, and support side walls 32 can all comprise or be the same material, for example an anisotropically etchable crystalline material such as a semiconductor like silicon.

Referring to FIG. 3, in some embodiments, substrate 10 has a substrate surface 14, first and second cavity side walls 62, 64 project away from or over substrate surface 14, and cavity 60 is formed on, above, or over substrate surface 14, for example on substrate 10. A bottom of cavity 60 can be planar (e.g., as a cavity floor 66) and can be, but is not necessarily, co-planar with substrate surface 14. First and second cavity side walls 62, 64 can comprise, for example, a dielectric material deposited and photolithographically patterned on substrate surface 14 and can be substantially orthogonal to substrate surface 14. In some embodiments, first and second cavity side walls 62, 64 are separately formed and then subsequently disposed on substrate surface 14.

In some embodiments of the present disclosure, cavity 60 has substantially planar, vertical, and rectangular first and second cavity side walls 62, 64, cavity end walls 65, and cavity floor 60. Cavity 60 can be disposed above or on substrate surface 14, for example as shown in FIG. 3, or can be disposed or formed in substrate 10, for example as shown in FIGS. 4A-4C. FIG. 4A illustrates cavity 60, first cavity side wall 62, and support 30 disposed below substrate surface 14 in substrate 10. FIG. 4B includes device 20 and cap 80 with cap tether 82. Cap 80 can include cap tether 82 as a result of micro-transfer printing cap 80 onto substrate 10 as discussed further below. FIG. 4C illustrates the overhanging device cavity structure 99 in cross section.

As shown in the exploded perspective of FIG. 3, overhanging device cavity structure 99 can comprise a cap 80 disposed over cavity 60 and in contact with and adhered to substrate 10 (as shown in FIG. 4C). In some embodiments, cap 80 comprises first and second cavity side walls 62, 64 in a common structure (e.g., as shown in FIG. 5). Cavity 60 can thus be disposed in substrate 10 (e.g., as in FIGS. 4A-4C), above substrate surface 14 (e.g., as in FIG. 3) or comprise portions that are both disposed in substrate 10 and above substrate 10 (e.g., as shown in FIG. 5 and, with a cap 80, would be the case for FIGS. 1A-2B so that the first and second cavity walls 62, 64 and cavity end walls 65 extend beyond substrate surface 14). Cap 80 can be micro-transfer printed from a source wafer and can comprise a broken or separated cap tether 82 as a consequence of the micro-transfer printing process. In some embodiments, device 20 is micro-transfer printed and comprises a broken or separated device tether 22. Examples of device and cap tethers 22, 82 are shown in FIG. 3.

Figure 6A:
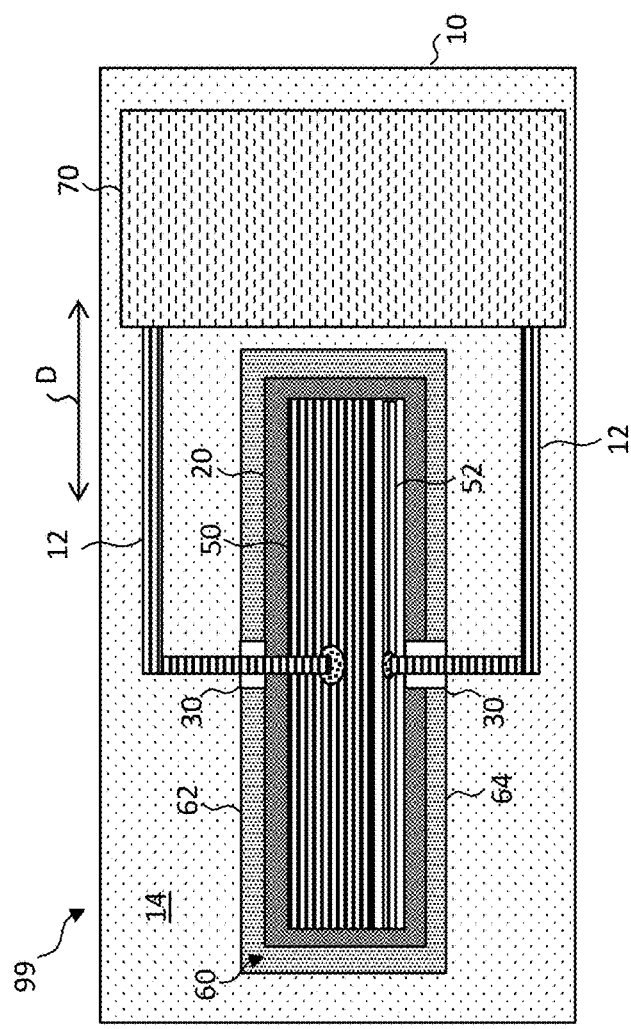
FIG. 6A is a top view according to illustrative embodiments of the present disclosure and FIG. 6B is a partial mask layout for constructing the embodiment of FIG. 2A.
Figure 6B:
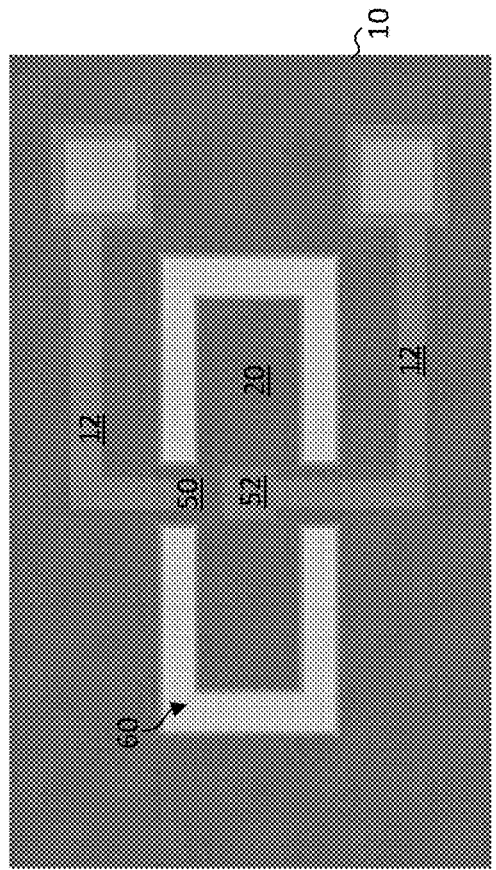

Referring to FIGS. 6A and 6B, in some embodiments of the present disclosure, substrate 10 is a semiconductor substrate (such as silicon) and comprises an electronic circuit 70. Circuit 70 can be electrically connected through substrate electrodes 12 and device top and bottom electrodes 50, 52 to control, provide signals to, or respond to device 20 or some combination thereof. Circuit 70 can be disposed in cavity 60, extend beyond cavity 60, or be disposed on or in substrate 10 in a portion of substrate 10 different from cavity 60 (e.g., as shown in FIG. 6A). Circuit 70 can interface with other electronic devices external to cavity 60, for example by electrically connecting to the other electronic devices, such as control circuits, with substrate electrodes 12 extending along substrate surface 14. Circuit 70 can comprise substrate 10 material, for example semiconductor material or can comprise electronic devices disposed on substrate 10, for example by micro-transfer printing, and therefore comprise a broken or separated device tether (not shown in the Figures).

Figure 7:
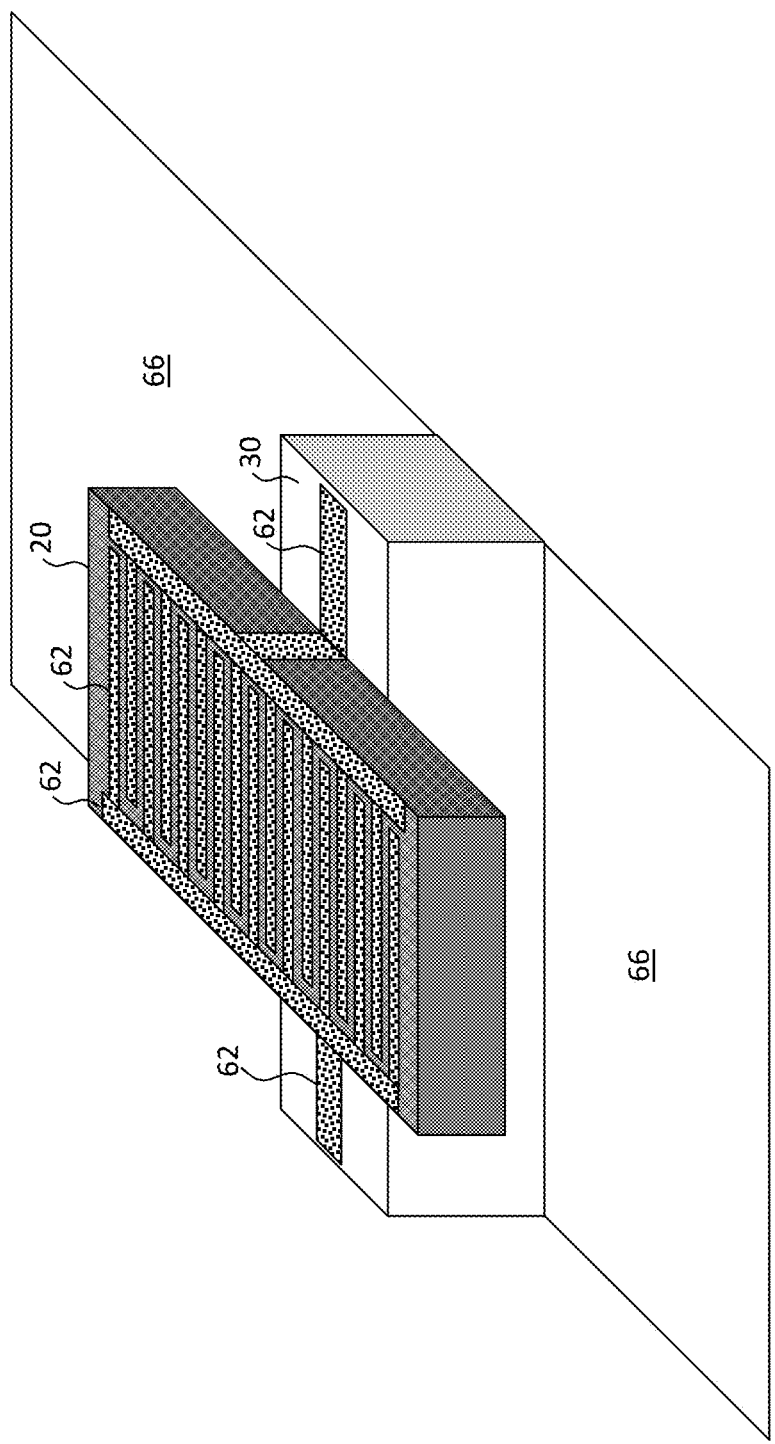
FIG. 7 is a cut-away perspective excluding cavity walls and comprising interdigitated electrodes according to illustrative embodiments of the present disclosure.

Device top electrode 50 can be disposed on a side of device 20 opposite cavity 60 and substrate 10 and device bottom electrode 52 can be disposed on a side of device 20 adjacent cavity 60 and substrate 10. An opposite side is a side for which device 20 is between the side and the cavity 60 or substrate 10. An adjacent side is a side for which device 20 is not between the side and the cavity 60 or substrate 10. Device top and bottom electrodes 50, 52 can electrically control or respond to device 20. Although only one each of top and bottom electrodes 50, 52 is illustrated in FIGS. 1A-2B, in some embodiments of the present disclosure, multiple top electrodes 50, for example two are provided (e.g., as shown in FIG. 7), or multiple bottom electrodes 52, for example two, are provided, or multiple top and multiple bottom electrodes 50, 52 are provided. In some examples, a pair of top and bottom electrodes 50, 52 can provide input signals and another different pair of top and bottom electrodes 50, 52 can receive output signals to device 20 or a pair of top electrodes 50 can provide input signals to, and a corresponding pair of bottom electrodes 52 can receive output signal from, device 20, or vice versa.

In some embodiments of the present disclosure, support 30 has a first support end in contact with first cavity side wall 62 and a second support end in contact with second cavity side wall 64. Top electrode 50 can extend along support 30 to the first support end and first cavity side wall 62 and bottom electrode 52 can extend along support 30 to the second support end and second cavity side wall 64. Referring to FIG. 7, in some embodiments of the present disclosure, two or more top electrodes 50 or two or more bottom electrodes 52 are interdigitated. In some embodiments, a length greater than a width of fingers of any interdigitated electrodes can extend across the width of device 20, to induce or respond to device 20 movement in the lengthwise direction of device 20.

In some embodiments, device 20 comprises a piezoelectric material and is a piezo-electric device. In some embodiments of the present disclosure, device 20 is an acoustic wave filter or a resonator. Device 20 can be a surface acoustic wave filter or a bulk acoustic wave filter. In some embodiments of overhanging device cavity structure 99, device 20 comprises one or more of aluminum nitride, zinc oxide, bismuth ferrite, lead zirconate titanate, lanthanum-doped lead zirconium titanate, potassium niobate, or potassium niobate, and $(K,Na)NbO_3$ (KNN).

Figure 8:
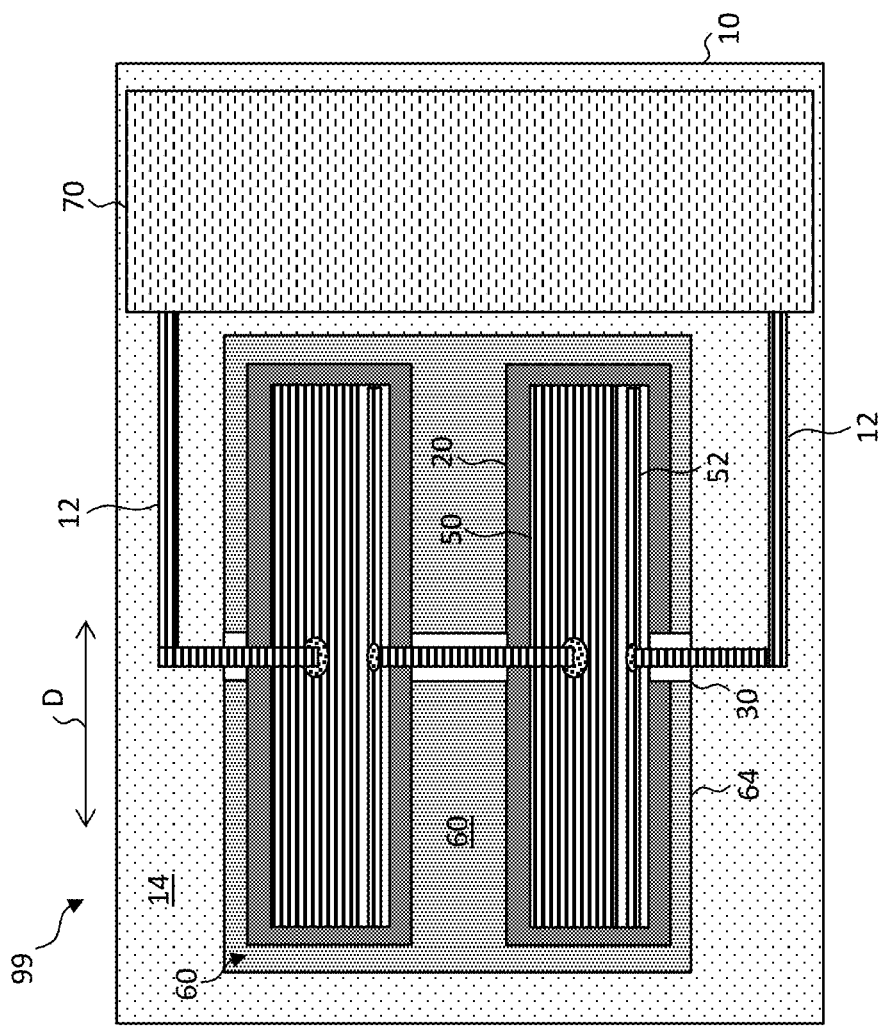
FIG. 8 is a top view of two devices provided on a common support and in a common cavity according to illustrative embodiments of the present disclosure.
Figure 9:
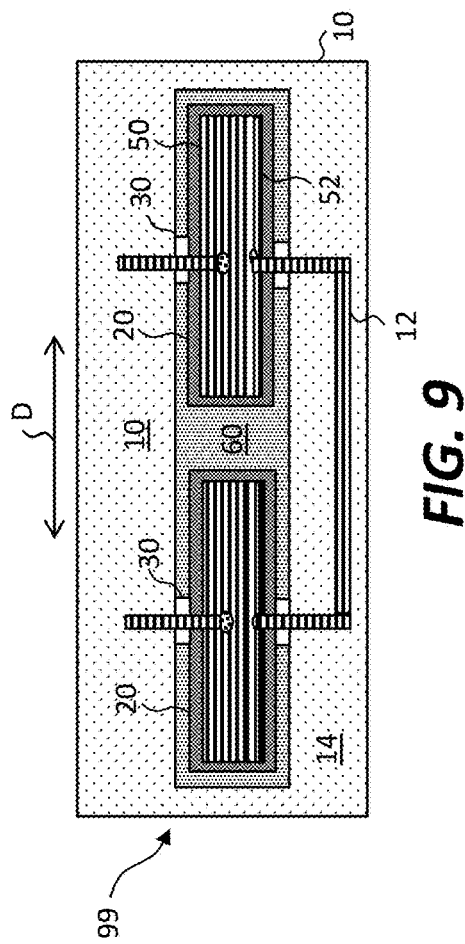
FIG. 9 is a top view of two devices, each provided on a separate support and in a common cavity, according to illustrative embodiments of the present disclosure.

Referring to FIGS. 8 and 9, two or more devices 20 are provided on a support 30 in a common cavity 60. Referring to FIG. 8, in some embodiments of the present disclosure, two or more devices 20 are in contact with a common support 30 in a common cavity 60. Referring to FIG. 9, in some embodiments of the present disclosure, two or more devices 20 are each disposed on a separate support 30 but are provided in a common cavity 60. In some embodiments of the present disclosure, an overhanging device cavity structure 99 comprises two or more supports 30, each support 30 extending from first cavity side wall 62 to second side wall 64. Each of the two or more supports 30 at least partially divide cavity 60, for example into three cavity portions, for example as shown in FIG. 9. A device 20 is in contact (e.g., direct contact) with each support 30 and extends in side direction D beyond each support 30 and is above and separated by a gap G from a bottom of cavity 60 (e.g., as shown in FIG. 1).

The two or more devices 20 in a common cavity 60 can be electrically connected, as shown, or can be electrically separate. By providing two or more devices 20 in a common cavity 60, more devices 20 can be provided in a smaller area or structure and additional signal processing can be provided by devices 20. The two or more devices 20 can all be a same kind of device 20 or can be different kinds of devices, the two or more devices 20 can all comprise similar or the same materials or can comprise one or more different materials. The two or more devices 20 can provide similar or the same one or more functions or can provide one or more different functions.

Figure 10:
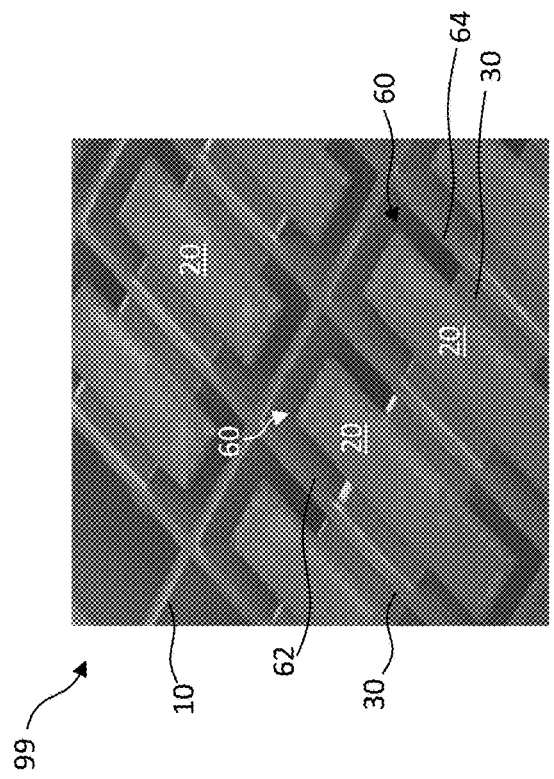
FIG. 10 is a micrograph of devices, each in a separate cavity, according to illustrative embodiments of the present disclosure.
Figure 11:
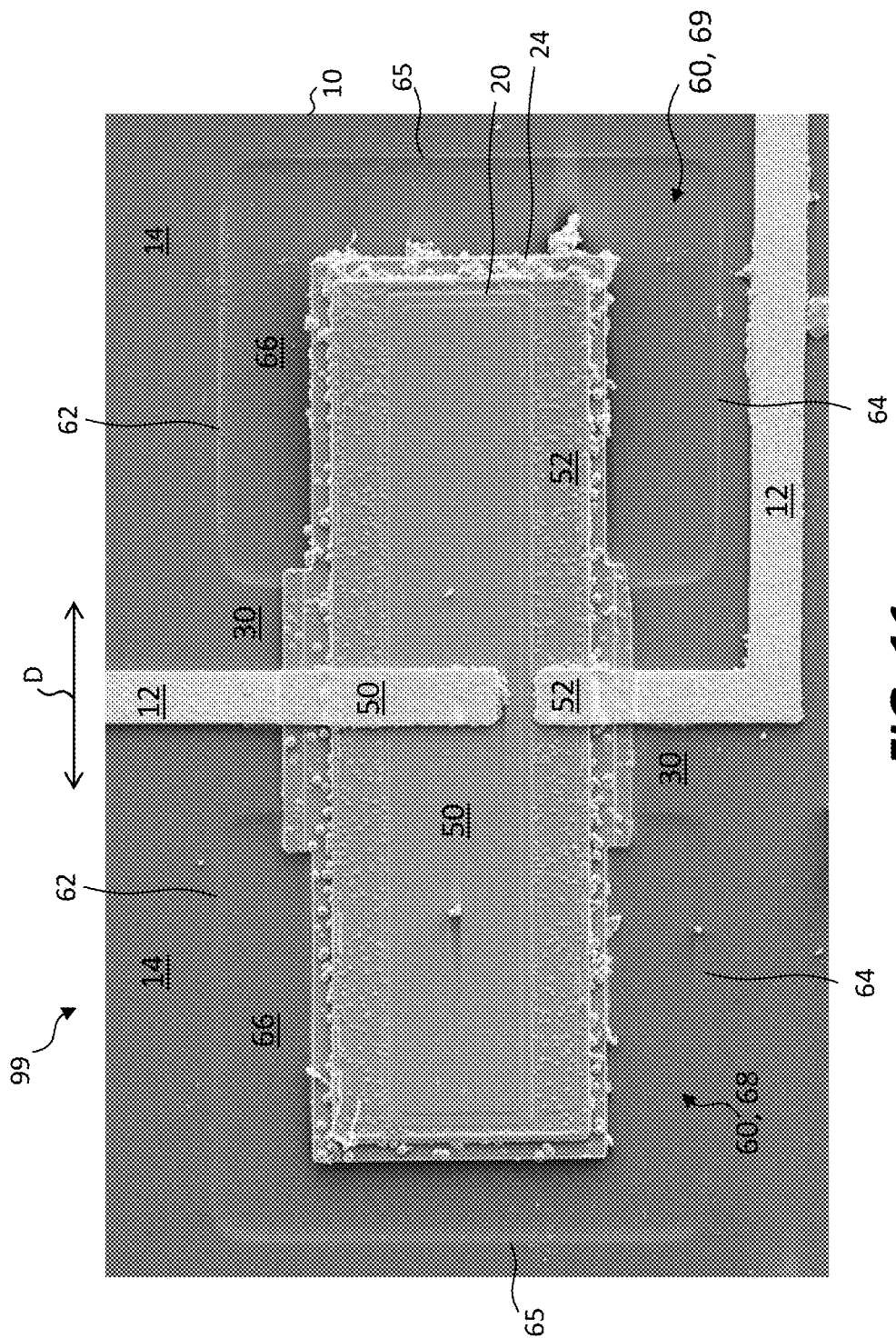
FIG. 11 is a micrograph of a device according to illustrative embodiments of the present disclosure.

FIG. 10 is a micrograph providing a perspective view of several constructed overhanging device cavity structures 99, each comprising a device 20 disposed in a common substrate 10 and a support 30 extending between first and second cavity side walls 62, 64. FIG. 11 is a top view micrograph illustrating a device 20 coated with a top electrode 50 and a bottom electrode 52 (extending from under device 20) on a device support layer 24 disposed on support 30. Support 30 extends from first cavity side wall 62 to second cavity side wall 64 in substrate 10. One end of device 20 is disposed over first cavity portion 68 and the other opposite end of device 20 is disposed over second cavity portion 69. (First and second cavity portions 68, 69 together form cavity 60.) Substrate electrodes 12 electrically connected to top and bottom electrodes 50, 52 extend over substrate surface 14 and can be electrically connected to a circuit 70 (not shown in FIG. 11).

Certain embodiments of the present disclosure can be constructed, for example, by photolithographic methods and materials, including material deposition by evaporative, spin, or slot coating, patterning, curing, etching, and stripping photoresists, and pattern-wise or blanket etching deposited materials, for example with gas, wet, or dry etchants. Materials can include metals (for example, such as aluminum, gold, silver, tin, tungsten, and titanium), polymers (for example such as photoresists, resins, epoxies, and polyimide), and oxides and nitrides (for example such as silicon dioxide and silicon nitride). Some elements of an overhanging device cavity structure 99 can be micro-transfer printed from a source wafer, for example device 20, cap 80, or circuit 70. In some embodiments, if a device 20 is micro-transfer printed from a source wafer, device 20 can comprise a device tether 22, for example as shown in FIG. 3. Likewise, in some embodiments, if cap 80 is micro-transfer printed from a source wafer, cap 80 can comprise a cap tether 82, for example as shown in FIG. 3. In some embodiments, if circuit 70 is micro-transfer printed from a source wafer, circuit 70 can comprise a circuit tether (not shown in the Figures).

Figure 12:
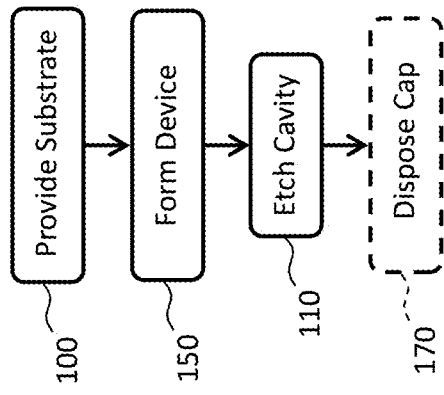
FIGS. 12-14 are flow diagrams according to illustrative embodiments of the present disclosure.

In some embodiments of the present disclosure a method is performed in accordance with FIG. 12. In step 100 an anisotropically etchable substrate 10 such as crystalline silicon or a substrate 10 with a patterned etchable sacrificial layer, for example an oxide layer having two portions corresponding to first and second cavity portions 68, 69, is provided. Metal (for example, aluminum, tin, silver, gold or other conductive materials) is deposited, for example by evaporation, and patterned, for example using coated photoresist patterned with UV radiation through a pattern mask that is developed, etched, and stripped, to form bottom electrode 52. Substrate electrodes 12 can be formed at the same time in the same steps. Any circuits 70 can be formed before or after the metal patterning steps (or later in the process). A device material, for example a piezo-electric material such as PLZT or KNN is deposited and patterned in step 150 to form device 20, for example using evaporative deposition and a patterned dry etch. Alternatively, device 20 can be transferred (e.g., micro-transfer printed) onto substrate 10, for example from a source wafer. After device 20 is provided in step 150, a second metal layer is deposited and patterned to form top electrode 50, similarly to the formation of bottom electrode 52. Cavity 60 is then etched in step 110, for example with trimethylammonium hydroxide (TMAH) to form cavity 60 comprising first and second cavity portions 68, 69, and support 30 (for example as shown in FIGS. 1A-2B). An anisotropic etch proceeds quickly in some directions and slowly in others, to form first and second cavity portions 68, 69, as illustrated, for example in FIGS. 1A-2B. When two fast-etching planes meet, they cannot proceed and self-annihilate, forming a V-shaped cross section, for example inverted pyramids in three dimensions, for example as shown in the FIGS. 1A, 1C, 1E or forming a trapezoidal-shaped cross section, for example as shown in FIGS. 1F, 2A, and 2B. Thus, the differentially etchable etch planes can form a triangular cross section in the width direction of device 20 and, in the length direction of device 20, can form a triangular cross section (as in FIG. 1A, 1D) or a trapezoidal cross section (as in FIGS. 1F, 2A, and 2B), depending on the relative dimensions of cavity 60 and support 30 and the crystalline structure of substrate 10. In some embodiments of the present disclosure, anisotropic etching of substrate 10 to provide cavity 60 can form cavity end walls 65, first and second cavity side walls 62, 64, and support side walls 32. In optional step 170, a cap 80 is optionally provided and disposed over cavity 60 and adhered to substrate 10. Cap 80 can include portions (or all) of first and second cavity side walls 62, 64 and cavity end walls 65, for example as shown in FIG. 5, so that cavity 60 extends above substrate surface 14. For example, first and second cavity side walls 62, 64, cavity end walls 65, or both first and second cavity side walls 62, 64 and cavity end walls 65 can be a single structure (e.g., comprising one or more etch planes of an anisotropically etchable substrate) or include multiple structures (e.g., one or more etch planes and a portion of a cap or wall structure disposed on substrate 10). Various structures according to certain embodiments of the present disclosure have been constructed as described herein.

According to some embodiments of the present disclosure, a method of making an overhanging device cavity structure 99 comprises providing a substrate 10 having a substrate surface 14, substrate 10 comprising a material that is anisotropically etchable, disposing a device 20 on substrate surface 14, for example by constructing or micro-transfer printing device 20 on substrate surface 14, etching substrate 10 to undercut device 20 thereby forming support 30 on which device 20 is disposed and cavity 60 into which device 20 extends, and optionally disposing a cap 80 over cavity 60. Cap 80 can comprise portions (or all) of first and second cavity side and end walls 62, 64, 65 so that cavity 60 extends above substrate surface 14, for example as shown in FIG. 5.

Additional layers, for example patterned titanium, nickel, or gold layers can be provided to coat or protect various elements of overhanging device cavity structure 99, for example device 20, from etchants or other process steps. Such layers can have a thickness of one micron or less, for example about 100 nm. Circuit 70 can be formed using conventional photolithographic methods and materials before, after, or during any steps used to form overhanging device cavity structure 99. Alternatively, circuit 70 can be transferred (e.g., micro-transfer printed) to substrate surface 14 before, after, or during any steps used to form overhanging device cavity structure 99.

Figure 13:
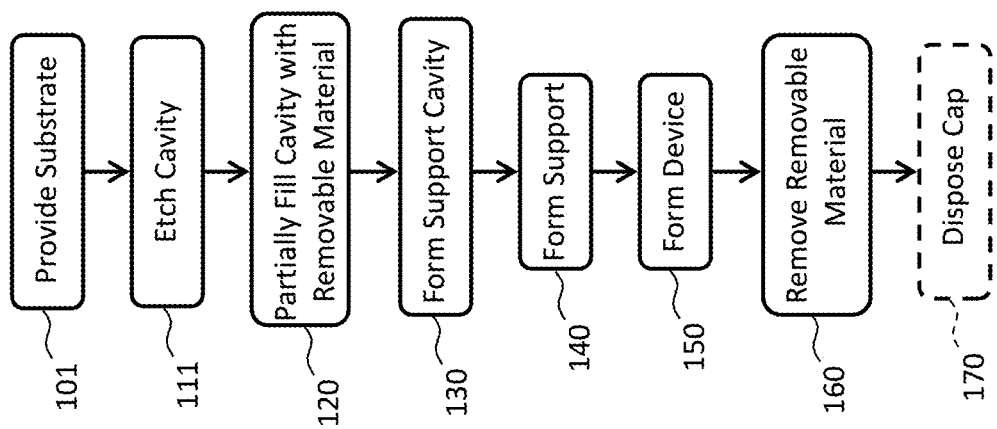
Figure 15A:
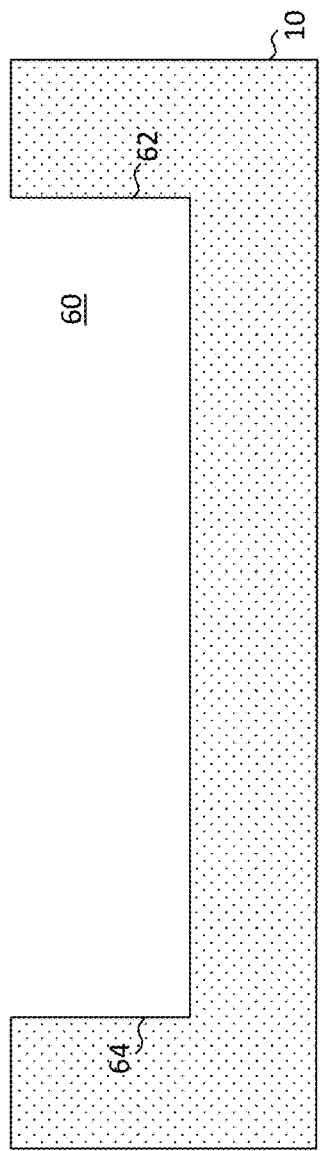
FIGS. 15A-15F are successive cross-sections of structures constructed according to illustrative embodiments of the present disclosure.
Figure 15B:
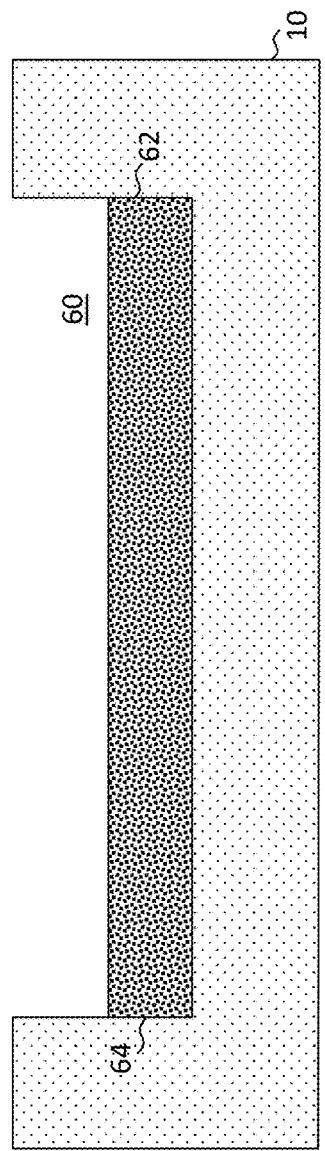
Figure 15C:
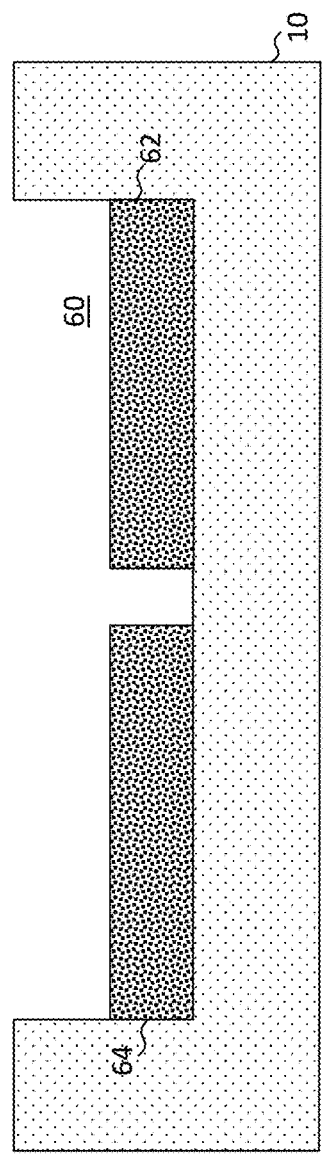
Figure 15D:
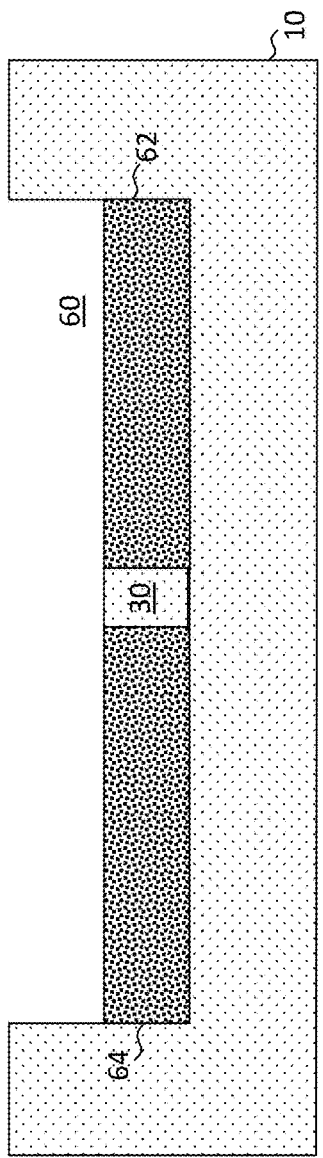
Figure 15E:
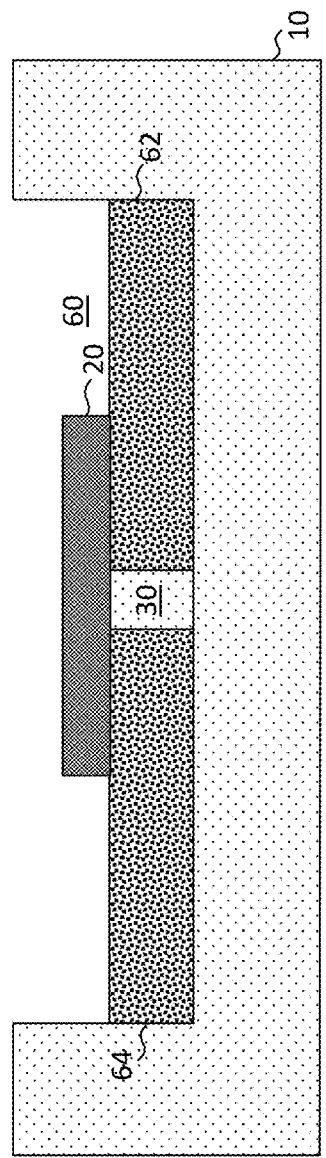
Figure 15F:
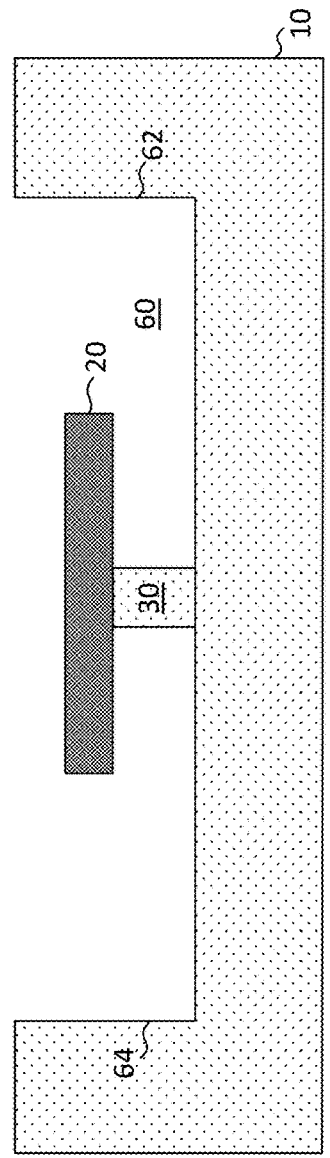

In some embodiments of the present disclosure a method is performed in accordance with FIG. 13. In step 101 a substrate 10, for example with a patterned etchable sacrificial layer having sacrificial portions laterally separated by anchors is provided. Cavity 60 can be formed in step 111, for example by etching the sacrificial portions, for example as shown in FIG. 15A. In step 120, cavity 60 is at least partially filled with a removable material, for example an organic material such as polyimide or other polymer or resin (or other differentially etchable material), for example as shown in FIG. 15B. The removable material is then patterned in step 130 to form a support cavity (e.g., as shown in FIG. 15C) that is then filled with material, for example with silicon dioxide, in step 140 to form support 30 (e.g., as shown in FIG. 15D). Support cavity can have a shape corresponding to, for example, any of the supports 30 disclosed herein, such as support 30 in FIGS. 1A-2B. Device 20 is then formed (for example by deposition and patterning) or otherwise disposed (for example by transferring (e.g., micro-transfer printing)) on the removable material and support 30 in step 150, for example as shown in FIG. 15E. The removable material is then removed in step 160, leaving device 20 disposed on support 30 with the ends of device 20 suspended over (overhanging) the bottom of cavity 60, for example as shown in FIGS. 15E and 4B. A cap 80 is then optionally disposed over cavity 60 and adhered to substrate 10. In some embodiments, a cap 80 is provided when device 20 is disposed entirely within cavity 60, for example as shown in FIG. 4C.

According to some embodiments of the present disclosure, a method of making an overhanging device cavity structure 99 comprises providing a substrate 10 and forming a cavity 60 in the substrate 10, cavity 60 comprising a first cavity side wall 62 and a second cavity side wall 64 opposing the first cavity side wall 62. Cavity 60 is at least partially filled with a removable material and a support cavity is formed in the removable material that extends from the first cavity side wall 62 to the second cavity side wall 64. A support 30 is formed in the support cavity that at least partially divides cavity 60. A device 20 is disposed on support 30 and the removable material. The removable material is then removed so that device 20 extends from support 30 into cavity 60. Optionally, a cap 80 is disposed over cavity 60. In some embodiments, a cap 80 is provided when device 20 is disposed entirely within cavity 60.

Figure 14:
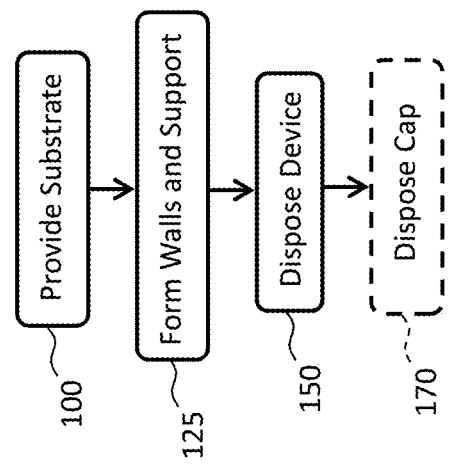

Referring to the FIG. 14 flow diagram and to the perspective of FIG. 3, in step 100 a substrate 10 with a substrate surface 14 is provided. In step 125 first and second cavity side walls 62, 64 and cavity end walls 65 are disposed on substrate surface 14, for example using photolithographic deposition and patterning methods and materials to construct first and second cavity side walls 62, 64 and cavity end walls 65 on substrate surface 14 of substrate 10. Support 30 can be formed also in step 125 (for example making the structure of FIG. 4A) or, alternatively, using steps 120-140 of FIG. 13. Device 20 is formed or otherwise disposed on support 30 in step 150, for example by constructing it on support 30 or transferring (e.g., micro-transfer printing) it from a device source wafer to support 30. If present, the removable material is then removed in step 160, leaving device 20 disposed on support 30 with the ends of device 20 suspended over (overhanging) the bottom of cavity 60, for example as shown in FIG. 3. A cap 80 is then optionally disposed over cavity 60 and adhered to substrate 10.

Thus, according to a method in accordance with some embodiments of the present disclosure, a method of making an overhanging device cavity structure 99 comprises providing a substrate 10 having a substrate surface 14, disposing cavity walls (for example first and second cavity side walls 62, 64 and cavity end walls 65) on substrate surface 14 to define a cavity 60 so that cavity 60 comprises at least a first cavity side wall 62 and a second cavity side wall 64 opposing first cavity side wall 62. A support 30 extending from first cavity side wall 62 to second cavity side wall 64 is disposed in cavity 60 and a device 20 is disposed on support 30 so that device 20 extends from support 30 into cavity 60. A cap 80 is optionally disposed over cavity 60.

As noted above, if a material comprising substrate 10 is anisotropically etchable, cavity 60 can be formed in substrate 10 by anisotropically etching the cavity material. In some embodiments of the present disclosure, a method making an overhanging device cavity structure 99 comprises providing a substrate 10 having a substrate surface 14 and spaced-apart sacrificial portions separated by a support 30. A device 20 is disposed on the substrate surface 14 and covering at least a portion of the sacrificial portions and support 30 such that no portion of device 20 extends beyond the area that bounds sacrificial portions and support 30. The sacrificial portions are etched to undercut device 20 and form a cavity 60 comprising a first cavity side wall 62 and a second cavity side wall 64 opposing first cavity side wall 62. The support 30 extends from first cavity side wall 62 to second cavity side wall 64 and at least partially divides cavity 60. A cap 80 is optionally disposed over cavity 60. In some embodiments, cavity 60 is at least partially filled with a removable material after sacrificial portions are etched, device 20 is then at least partially disposed on the removable material, and the removable material is removed.

Figure 16:
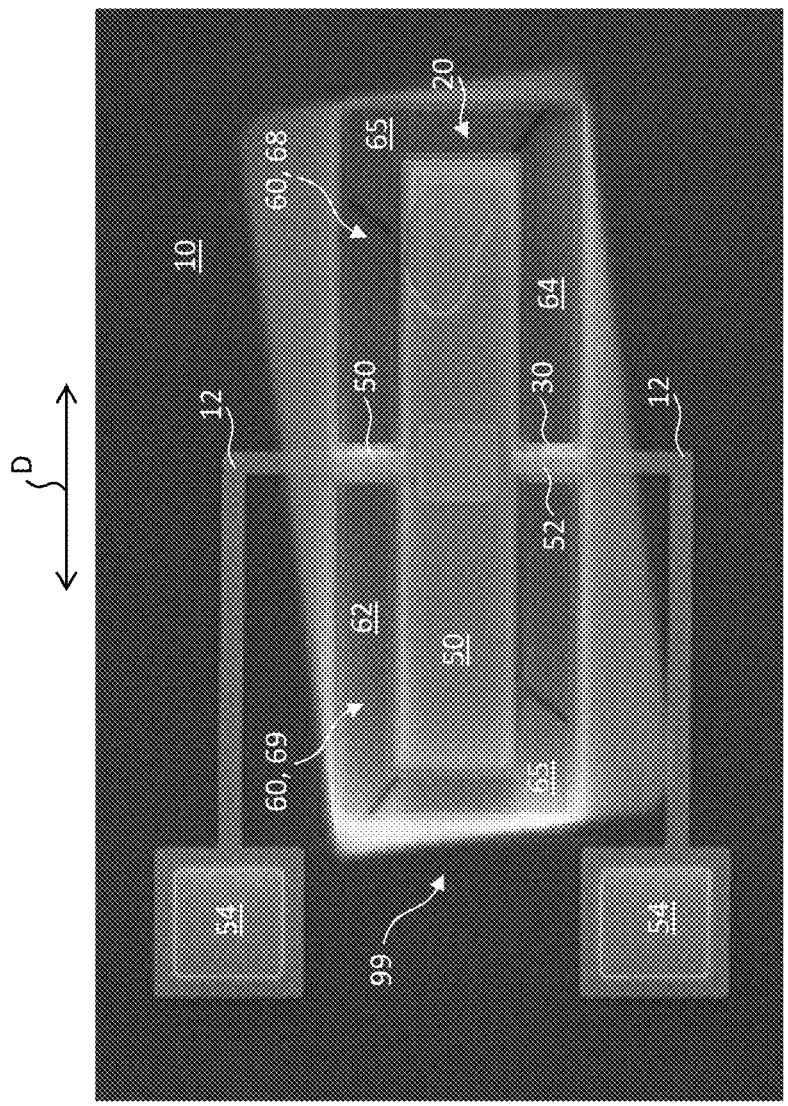
FIG. 16 is a micrograph of an overhanging device cavity structure according to illustrative embodiments of the present disclosure.
Figure 17:
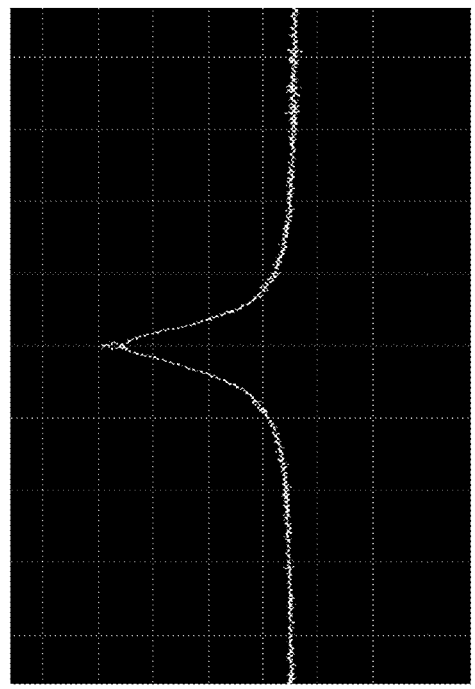
FIG. 17 is an enlarged, zoomed-in graph illustrating the performance of the device of FIG. 16 useful in understanding certain embodiments of the present disclosure.

In certain embodiments a structure including device 20 disposed on support 30 can be operated, for example, by providing power or control signals to top and bottom electrodes 50, 52, for example from circuit 70 or an external controller (not shown in the Figures) and, optionally, substrate electrodes 12. Device 20 responds to the power and control signals and operates to process any signals provided. Circuit 70 can control or otherwise operate or respond to devices 20. Device 20 can be a mechanically resonant piezo-electric device. By adhering or otherwise contacting a center portion of device 20 to support 30, some resonant modes of device 20, for example undesired modes, can be controlled, inhibited, suppressed, or reduced. In particular, resonant modes that extend and contract the length of device 20 can be preferentially enabled and other modes suppressed, similarly to a solidly mounted resonator, but in a more mechanically isolated structure, providing better performance in a more controlled structure that can be more easily constructed with fewer externally induced complications. Referring to FIG. 16, an overhanging device cavity structure 99 of substrate 10 comprising piezo-electric resonant device 20 disposed on support 30 in cavity 60 with first and second cavity side walls 62, 64 and cavity end walls 65 having ends suspended over (overhanging) first and second cavity portions 68, 69 with top and bottom electrodes 50, 52, for example as shown in FIGS. 2A and 2B and made in accordance with FIG. 12, has been constructed. The overhanging device cavity structure 99 has further been electrically tested with probes connected to contact pads 54 through substrate electrodes 12 and demonstrated to work with desirable frequency response and selectivity, as shown in FIG. 17. FIG. 17 is an enlarged graph showing the frequency response of overhanging device cavity structure 99 with a full-width half-max value of less than 10 kHz over a 20 MHz range.

Substrate 10 can be any suitable substrate, for example as found in the integrated circuit or display industries and can include glass, plastic, semiconductor, crystalline semiconductor, ceramic, sapphire, quartz, or metal materials. In some embodiments, substrate 10 can be processed using photolithographic methods and include photolithographic materials. Substrate 10 can comprise multiple layers (e.g., including an adhesive layer) and substrate surface 14 can be the top, exposed surface of substrate 10. In certain embodiments, substrate 10 is or comprises a member selected from the group consisting of polymer (e.g., plastic, polyimide, PEN, or PET), resin, metal (e.g., metal foil) glass, quartz, a semiconductor, and sapphire. In certain embodiments, a substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Cavity 60 can be of any useful size, for example having a length or width no greater than 10 mm (e.g., no greater than 1 mm, no greater than 500 microns, no greater than 100 microns, no greater than 50 microns, no greater than 25 microns, or no greater than 10 microns). Cavity 60 can have a length greater than a width and support 30 can extend across a width of cavity 60. The length of cavity 60 can be at least 1.5 times (e.g., at least two times, at least three times, or at least four times) greater than the width of cavity 60. Cavity 60 can have a depth of no greater than 1 mm (e.g., no greater than 500 microns, no greater than 100 microns, no greater than 50 microns, no greater than 20 microns, no greater than 10 microns, or no greater than 5 microns). In some embodiments, device 20 has a thickness of not more than two microns (e.g., not more than one micron, or not more than 500 nm and can be separated from a floor of cavity 60 by no more than 50 microns, no more than 20 microns, no more than 10 microns, no more than 5 microns, or no more than 2 microns). Devices 20 having a length of approximately 250 microns provided on a support 30 have been constructed (e.g., in accordance with the embodiments shown in FIG. 10 and FIG. 11).

In some embodiments, device 20 comprises a device material different from a support 30 material. In some embodiments, support 30 can comprise device 20 material. A support 30 material can be or comprise a patterned layer of dielectric 40, can comprise conductors, or can comprise an electrical conductor (e.g., a metal). A device 20 can comprise one or more device materials including, for example, one or more of GaN, AlGaN, AlN, gallium orthophosphate ($GaPO_4$), langasite ($La_3Ga_5SiO_{14}$), lead titanate, barium titanate ($BaTiO_3$), lead zirconate titanate ($Pb[Zr_xTi_{1-x}]O_3$ 0≤x≤1), potassium niobate ($KNbO_3$), lithium niobate ($LiNbO_3$), lithium tantalate ($LiTaO_3$), sodium tungstate ($Na_2WO_3$), $Ba_2NaNb_5O_5$, $Pb_2KNb_5O_{15}$, zinc oxide (ZnO), Sodium potassium niobate (($K,Na)NbO_3$) (NKN), bismuth ferrite ($BiFeO_3$), Sodium niobate ($NaNbO_3$), bismuth titanate ($Bi_4Ti_3O_{12}$), sodium bismuth titanate ($Na_{0.5}Bi_{0.5}TiO_3$), wurtzite, and polyvinylidene fluoride. A device 20 material can be or include a piezo-electric material that exhibits a piezo-electric effect. In some embodiments, device 20 can be processed or formed using photolithographic methods. Photolithographic methods and materials are also useful, in some embodiments, to form top and bottom electrodes 50, 52 and any device circuit 70.

As is understood by those skilled in the art, the terms "over" and "under" are relative terms and can be interchanged in reference to different orientations of the layers, elements, and substrates 10 included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, for example, a first layer on a second layer includes a first layer and a second layer with another layer therebetween (e.g., and in mutual contact). For example, an adhesive layer may be included therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

D side-wall direction
G gap
W width cross section
L length cross section
10 substrate
12 substrate electrode
14 substrate surface
20 device
22 device tether
24 device support layer
30 support
32 support side wall
40 dielectric
50 top electrode
52 bottom electrode
54 contact pad
60 cavity
62 first cavity side wall
64 second cavity side wall
65 cavity end wall
66 cavity floor
68 first cavity portion
69 second cavity portion
70 circuit
80 cap
82 cap tether
99 overhanging device cavity structure
100 provide substrate step
101 provide substrate step
110 etch cavity step
111 etch cavity step
120 partially fill cavity with removable material step
125 form walls and support step
130 form support cavity step
140 form support step
150 form device step
160 remove removable material step
170 optional dispose cap step

What is claimed:

1. An overhanging device cavity structure, comprising:
a substrate having a substrate surface;
a cavity comprising cavity walls disposed on and extending from the substrate surface, the cavity walls comprising a first cavity side wall and a second cavity side wall opposing the first cavity side wall;
a support extending from the first cavity side wall to the second cavity side wall, the support at least partially dividing the cavity; and
a device disposed on and in direct contact with the support and extending from the support into the cavity, the device comprising a material different from a material of the substrate, different from a material of the first cavity side wall, and different from a material of the second cavity side wall,
wherein the first cavity side wall and the second cavity side wall each comprise a patterned dielectric material deposited on the substrate surface.

2. The overhanging device cavity structure of claim 1, wherein the first and second cavity side walls comprise a material different from a material of the substrate.

3. An overhanging device cavity structure, comprising:
a substrate having a substrate surface;
a cavity formed in the substrate partially beneath the substrate surface and comprising cavity walls extending from the substrate surface, the cavity walls comprising a first cavity side wall and a second cavity side wall opposing the first cavity side wall;
a support extending from the first cavity side wall to the second cavity side wall, the support in direct contact with the first cavity side wall, in direct contact with the second cavity side wall, and at least partially dividing the cavity; and
a device disposed on and in direct contact with the support and extending from the support into the cavity, the device comprising a material different from a material of the substrate, different from a material of the first cavity side wall, and different from a material of the second cavity side wall,
wherein the first cavity side wall and the second cavity side wall each comprise a patterned dielectric material deposited on the substrate surface.

4. The overhanging device cavity structure of claim 3, wherein the cavity has a cavity floor.

5. The overhanging device cavity structure of claim 4, wherein the cavity floor is substantially rectangular and planar.

6. The overhanging device cavity structure of claim 3, wherein the cavity has a bottom that comprises one or more surfaces corresponding to one or more etch planes of an anisotropically etchable crystal.

7. The overhanging device cavity structure of claim 3, wherein the first and second cavity side walls comprise a material different from a material of the substrate.

8. An overhanging device cavity structure, comprising:
a substrate having a substrate surface;
a cavity comprising cavity walls disposed on and extending from the substrate surface, the cavity walls comprising a first cavity side wall and a second cavity side wall opposing the first cavity side wall;
a support extending from the first cavity side wall to the second cavity side wall, the support at least partially dividing the cavity; and
a device disposed on the support and extending from the support into the cavity,
wherein the first cavity side wall and the second cavity side wall each comprise a patterned dielectric material deposited on the substrate surface,
wherein the device is in direct contact with the support.

9. The overhanging device cavity structure of claim 8, wherein the support and the substrate comprise a same material.

10. The overhanging device cavity structure of claim 8, wherein the device comprises a material different from a material of the substrate, different from a material of the first cavity side wall, and different from a material of the second cavity side wall.

11. The overhanging device cavity structure of claim 8, wherein the device is supported only by the support.

* * * * *